(12) United States Patent
Ishida et al.

(10) Patent No.: US 11,581,341 B2
(45) Date of Patent: Feb. 14, 2023

(54) LIQUID CRYSTAL DISPLAY DEVICE

(71) Applicant: Funai Electric Co., Ltd., Osaka (JP)

(72) Inventors: Toshiyuki Ishida, Osaka (JP); Kenta Ide, Osaka (JP)

(73) Assignee: FUNAI ELECTRIC CO., LTD., Osaka (JP)

( * ) Notice: Subject to any disclaimer, the term of this patent is extended or adjusted under 35 U.S.C. 154(b) by 0 days.

(21) Appl. No.: 17/392,438

(22) Filed: Aug. 3, 2021

(65) Prior Publication Data

US 2021/0366939 A1 Nov. 25, 2021

Related U.S. Application Data

(63) Continuation of application No. 16/791,254, filed on Feb. 14, 2020, now Pat. No. 11,088,179, which is a
(Continued)

(30) Foreign Application Priority Data

Jul. 25, 2016 (JP) .............................. JP2016-145544

(51) Int. Cl.
*H01L 27/12* (2006.01)
*G09G 3/36* (2006.01)
(Continued)

(52) U.S. Cl.
CPC .......... *H01L 27/124* (2013.01); *G02F 1/1335* (2013.01); *G04G 9/0035* (2013.01);
(Continued)

(58) Field of Classification Search
CPC ...... G09G 3/3688; G09G 3/3685; G09G 3/36; G09G 2320/0223; G04G 9/0035; G02F 1/1335; H01L 27/124
See application file for complete search history.

(56) References Cited

U.S. PATENT DOCUMENTS

| 5,801,673 A | 9/1998 | Shimada et al. |
| 10,608,023 B2 | 3/2020 | Ishida et al. |

(Continued)

FOREIGN PATENT DOCUMENTS

| CN | 101452676 A | 6/2009 |
| CN | 104424907 A | 3/2015 |

(Continued)

OTHER PUBLICATIONS

Extended European Search Report of the corresponding European Application No. 17182271.1, dated Sep. 12, 2017.
(Continued)

*Primary Examiner* — Abbas I Abdulselam
(74) *Attorney, Agent, or Firm* — Global IP Counselors, LLP

(57) ABSTRACT

A liquid crystal display device comprises a display panel, at least one signal generator, and a plurality of wires. The display panel has a plurality of input ends to receive data signal. The at least one signal generator has a plurality of output ends to supply the data signal to the input ends of the display panel, respectively. The wires connects the output ends of the at least one signal generator to the input ends of the display panel, respectively, the wires having lengths measured between the output ends of the at least one signal generator and the input ends of the display panel, respectively, the length of the wires being different from each other according to location of the output ends of the at least one signal generator.

19 Claims, 14 Drawing Sheets

Related U.S. Application Data continuation of application No. 16/557,247, filed on Aug. 30, 2019, now Pat. No. 10,608,023, which is a continuation of application No. 16/239,960, filed on Jan. 4, 2019, now Pat. No. 10,411,043, which is a continuation of application No. 15/653,416, filed on Jul. 18, 2017, now Pat. No. 10,411,040.

(51) Int. Cl.
    *G02F 1/1335*     (2006.01)
    *G04G 9/00*     (2006.01)
    *G02F 1/136*     (2006.01)

(52) U.S. Cl.
    CPC ......... *G09G 3/3685* (2013.01); *G09G 3/3688* (2013.01); *G02F 1/136* (2013.01); *G09G 3/36* (2013.01); *G09G 2320/0223* (2013.01); *G09G 2320/0233* (2013.01)

(56) References Cited

U.S. PATENT DOCUMENTS

| | | | |
|---|---|---|---|
| 11,088,179 B2 * | 8/2021 | Ishida | G09G 3/3688 |
| 2002/0180681 A1 | 12/2002 | Shen | |
| 2005/0041002 A1 | 2/2005 | Takahara et al. | |
| 2008/0172570 A1 | 7/2008 | Hsu et al. | |
| 2010/0156945 A1 | 6/2010 | Yoshida | |
| 2012/0081410 A1 | 4/2012 | Yeo et al. | |
| 2012/0235968 A1 | 9/2012 | Todorovich et al. | |
| 2013/0293599 A1 | 11/2013 | Wakisaka et al. | |
| 2014/0300591 A1 | 10/2014 | Aoki et al. | |
| 2015/0061985 A1 | 3/2015 | Sugiyama | |
| 2015/0131020 A1 | 5/2015 | Chang | |
| 2015/0187304 A1 | 7/2015 | Ko et al. | |
| 2016/0307543 A1 | 10/2016 | Lim | |
| 2017/0221443 A1 | 8/2017 | Koh et al. | |

FOREIGN PATENT DOCUMENTS

| | | |
|---|---|---|
| JP | 2006-338012 A | 12/2006 |
| KR | 10-0934974 B1 | 1/2010 |

OTHER PUBLICATIONS

European search report of the European application No. 19150798.7, dated May 3, 2019.

* cited by examiner

LIQUID CRYSTAL DISPLAY DEVICE

CROSS-REFERENCE TO RELATED APPLICATIONS

This is a continuation application of U.S. patent application Ser. No. 16/791,254 filed on Feb. 14, 2020, which is a continuation application of U.S. patent application Ser. No. 16/557,247 filed on Aug. 30, 2019, now U.S. Pat. No. 10,608,023, which is a continuation application of U.S. patent application Ser. No. 16/239,960 filed on Jan. 4, 2019, now U.S. Pat. No. 10,411,043, which is a continuation application of U.S. patent application Ser. No. 15/653,416 filed on Jul. 18, 2017, now U.S. Pat. No. 10,411,040. This application claims priority to Japanese Patent Application No. 2016-145544 filed on Jul. 25, 2016. The entire disclosures of U.S. patent application Ser. Nos. 16/791,254, 16/557,247, 16/239,960 and 15/653,416 and Japanese Patent Application No. 2016-145544 are hereby incorporated herein by reference.

BACKGROUND

Field of the Invention

The present invention generally relates to a liquid crystal display device.

Background Information

A tri-gate structure or a dual-gate structure has been used in recent years as a cell drive system for liquid crystal display devices. With a tri-gate structure, for example, signals are simultaneously applied to three pixels via data lines from a signal generator (source driver). Thus, the required number of source drivers can be reduced, which can lower the cost. Japanese Laid-Open Patent Application Publication No. 2006-338012 (Patent Literature 1) discusses a technique related to a liquid crystal display device such as this.

SUMMARY

As the display panels used in liquid crystal display devices have become larger in recent years, the wires (source lines) from the signal generator (source driver) to the input ends of the pixels of the display panel tend to become longer. Also, the use of a tri-gate structure or a dual-gate structure reduces the required number of source drivers. Thus, the output ends of a single source driver have to be connected to input ends of the pixels of the display panel that are farther away, which makes the wires become longer. A longer wire has higher resistance than a shorter wire. This wire resistance blunts the voltage waveform outputted from the source driver at the input ends of the pixels of the display panel. Consequently, a difference in charge voltage occurs between pixels connected to longer and shorter wires. This produces variance in the brightness and chromaticity seen by a viewer.

One object is to provide a liquid crystal display device with which variance in brightness and chromaticity on the display panel is prevented.

In view of the state of the known technology and in accordance with an aspect of the present invention, a liquid crystal display device comprises a display panel, at least one signal generator, and a plurality of wires. The display panel has a plurality of input ends to receive data signal. The at least one signal generator has a plurality of output ends to supply the data signal to the input ends of the display panel, respectively. The wires connects the output ends of the at least one signal generator to the input ends of the display panel, respectively, the wires having lengths measured between the output ends of the at least one signal generator and the input ends of the display panel, respectively, the length of the wires being different from each other according to location of the output ends of the at least one signal generator.

BRIEF DESCRIPTION OF THE DRAWINGS

Referring now to the attached drawings which form a part of this original disclosure.

DETAILED DESCRIPTION OF EMBODIMENTS

Selected embodiments will now be explained with reference to the drawings. It will be apparent to those skilled in the art from this disclosure that the following descriptions of the embodiments are provided for illustration only and not for the purpose of limiting the invention as defined by the appended claims and their equivalents. The numerical values, shapes, materials, constituent elements, positional layout and connection mode of the constituent elements, and so forth in the following embodiments are just examples, and are not intended to limit the present invention. Also, of the constituent elements in the following embodiments, those not mentioned in an independent claim will be described as optional constituent elements.

First Embodiment

Figure 1:
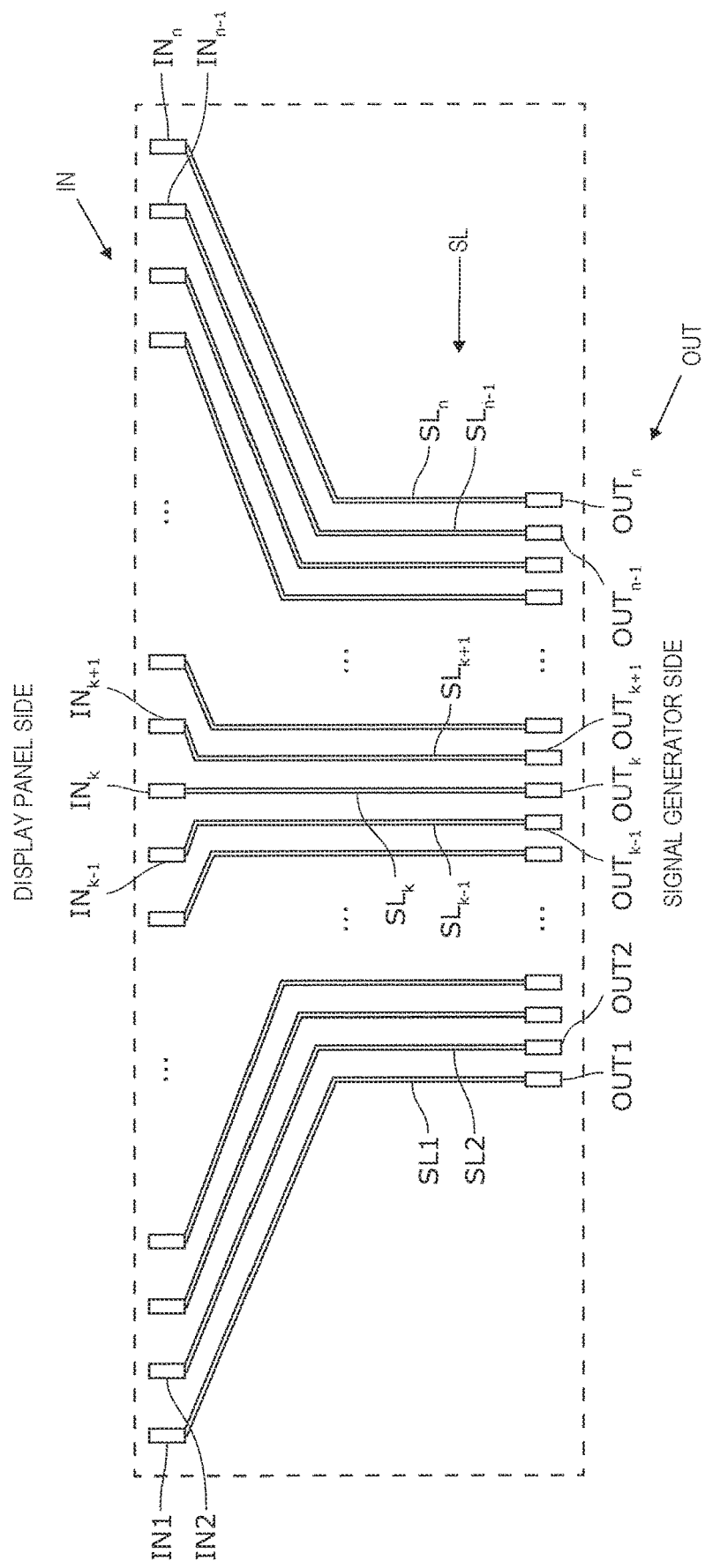
FIG. 1 is a schematic diagram of a plurality of wires that spread out in a fan shape and connect a display panel and a signal generator of a liquid crystal display device in accordance with a first embodiment.

A liquid crystal display device 1 in accordance with a first embodiment will be described through reference to FIGS. 1 to 8. FIG. 1 is a schematic diagram of a plurality of wires SL that spread out in a fan shape and connect a display panel 10 and a signal generator 20 of the liquid crystal display device 1.

As shown in FIG. 1, the wires (source lines) SL connect the output ends OUT (such as output terminals) of the signal generator (source driver) 20 to the input ends IN (such as input terminals) corresponding to a plurality of pixels $P_{ij}$ (i=1 to m, j=1 to n) (see FIG. 3) of the display panel 10. The signal generator 20 supplies data signals to the pixels $P_{ij}$ of the display panel 10 through the wires SL. Herein, the output ends OUT of the signal generator 20 will also be called simply output ends OUT, and the input ends IN corresponding to the pixels $P_{ij}$ will also be called simply input ends IN. In general, the pitch of the input ends IN is greater than the pitch of the output ends OUT, as shown in FIG. 1. In view of this, the wires SL spread out in a fan shape as shown in FIG. 1 to connect the output ends OUT to the input ends IN, respectively. Consequently, the wire SL that connect the output end OUT to the input end IN becomes longer as the output end OUT is located farther away from the input end IN.

The wires SL include wires SL1, SL2, . . . , $SL_k$, $SL_{k+1}$, . . . , $SL_{n-1}$, $SL_n$, as shown in FIG. 1. In other words, the wires SL1, SL2, . . . , $SL_k$, $SL_{k+1}$, . . . , $SL_{n-1}$, $SL_n$ are collectively referred to as the wires SL. The output ends OUT includes output ends OUT1, OUT2, . . . , $OUT_k$, $OUT_{k+1}$, . . . , $OUT_{n-1}$, $OUT_n$, as shown in FIG. 1. In other words, the output ends OUT1, OUT2, . . . , $OUT_k$, $OUT_{k+1}$, . . . , $OUT_{n-1}$, $OUT_n$ are collectively referred to as the output ends OUT. The input ends IN include input ends IN1, IN2, . . . , $IN_k$, $IN_{k+1}$, . . . , $IN_{n-1}$, $IN_n$, as shown in FIG. 1. In other words, the input ends IN1, IN2, . . . , $IN_k$, $IN_{k+1}$, . . . , $IN_{n-1}$, $IN_n$, are collectively referred to as the input ends IN. The shapes of the wires SL, output ends OUT, and input ends IN shown in FIG. 1 are shown in simplified form, and are not limited to such.

As shown in FIG. 1, the pitch of the input ends IN is greater than the pitch of the output ends OUT. Thus, the connection between the output ends OUT and the input ends IN is such that the length of the wires SL increases moving from the connection between the output end $OUT_k$ in the middle of the signal generator 20 and the input end $IN_k$ in the middle of the display panel 10, toward the connection between the output end OUT1 ($OUT_n$) on the outside of the signal generator 20 and the input end IN1 ($IN_n$) on the outside of the display panel 10. For instance, the wire $SL_k$ connecting the output end $OUT_k$ and the input end $IN_k$ is shorter (e.g., a short wire), and the wire SL1 ($SL_n$) connecting the output end OUT1 ($OUT_n$) and the input end IN1 ($IN_n$) is longer (e.g., a long wire). Thus, the output ends OUT and the input ends IN are connected by a plurality of wires SL of different lengths (e.g., wire lengths). Because the wires SL have different lengths, this produces variance in the voltage (charge voltage) applied to each pixel even if the same output voltage waveform is outputted to the output ends OUT from the signal generator 20. In the illustrated embodiment, the length of the wire SL means the length of the wire SL along the wire SL between the corresponding output end OUT and the corresponding input end IN.

Figure 2:
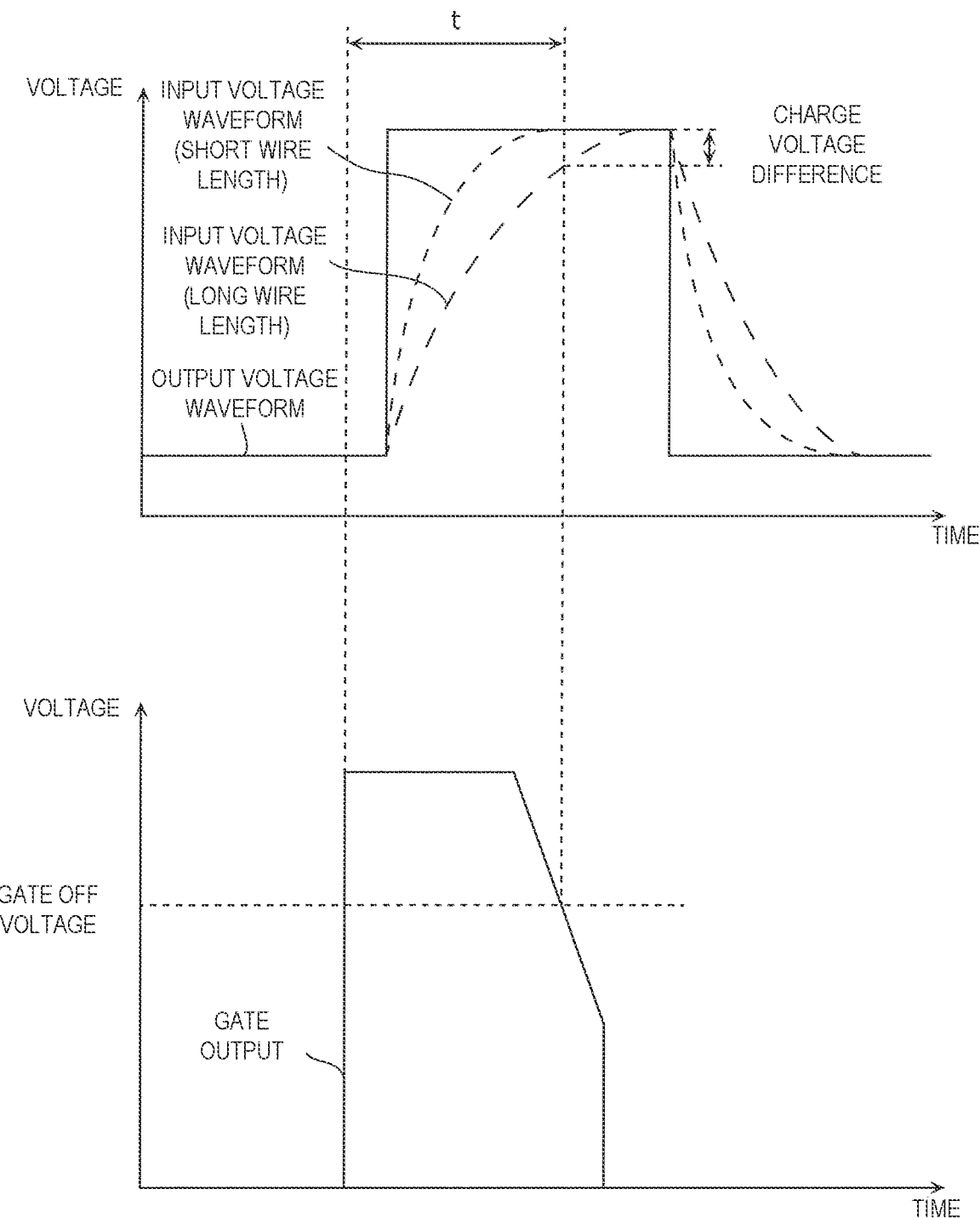
FIG. 2 is a diagram illustrating that a charge voltage difference occurs according to the wire length.

Referring now to FIG. 2, how the charge voltage varies according to the length of the wires SL will be described. FIG. 2 is a diagram illustrating that a charge voltage difference occurs according to the wire length.

The signal generator 20 outputs a rectangular voltage waveform, for example, as the voltage waveform corresponding to data signals supplied to the pixels. Thus, the voltage waveform shown at the top in FIG. 2 (output voltage waveform) is outputted from the output ends OUT. Incidentally, the pixels are capacitive. Thus, the current flow corresponds to the change in the output voltage waveform. There is a resistance component in the wires SL, which are current pathways through which this current flows. This results in a voltage drop at the input ends IN. Also, this voltage drop is proportional to the size of the resistance component. Consequently, the input voltage waveform at the input end IN connected to a long wire SL (wire length: long) shown at the top in FIG. 2 is blunter than the input voltage waveform at the input end IN connected to a short wire SL (wire length: short) that is shorter than the long wire SL. In the illustrated embodiment, as shown in FIG. 1, the wire $SL_k$ is the shortest wire of the wires SL, while the wires SL1 and $SL_n$ are the longest wire of the wires SL. In the illustrated embodiment, any one of the wires SL2 to $SL_{n-1}$ can be a "short wire" or "a wire of short length" with respect to a wire SL ("a long wire" or "a wire of long length") that is located farther away from the wire $SL_k$ (i.e., farther away from the middle of the signal generator 20, or father away from the middle of the display panel 10) than the one of the wires SL2 to $SL_{n-1}$. Also, any one of the wires SL1 to $SL_{k-1}$ and $SL_{k+1}$ to $SL_n$ can be a "long wire" or "a wire of long length" with respect to a wire SL ("a short wire" or "a wire of short length") that is located closer to the wire $SL_k$ (i.e., closer to the middle of the signal generator 20, or closer to the middle of the display panel 10) than the one of the wires SL1 to $SL_{k-1}$ and $SL_{k+1}$ to $SL_n$.

Also, when the gate output has the waveform shown on the bottom in FIG. 2, the signal generator 20 supplies data signals to the pixels in the period t (gate-on period). In this case, there is a difference in the charge voltage between the input end IN connected to the long wire SL and the input end IN connected to the short wire SL at the end point of the period t (that is, when the gate output changes from gate-on voltage to gate-off voltage). This charge voltage difference can be reduced by lengthening the gate-on period t. However, lengthening the gate-on period t can be difficult, depending on the number of pixels in the display panel 10 and the refresh rate. The period t shown in FIG. 2 is given here as an example of the gate-on period t.

Thus, variance occurs in the charge voltage applied to the pixels between the various wires SL because of the different lengths of the wires SL. Therefore, wire length can result in noticeable variance in brightness and chromaticity.

On the other hand, with the liquid crystal display device 1 in accordance with the first embodiment, it is made less likely that a difference in the lengths of the wires SL will produce variance in brightness and chromaticity.

The configuration of the liquid crystal display device 1 in accordance with the first embodiment will be described through reference to FIG. 3.

Figure 3:
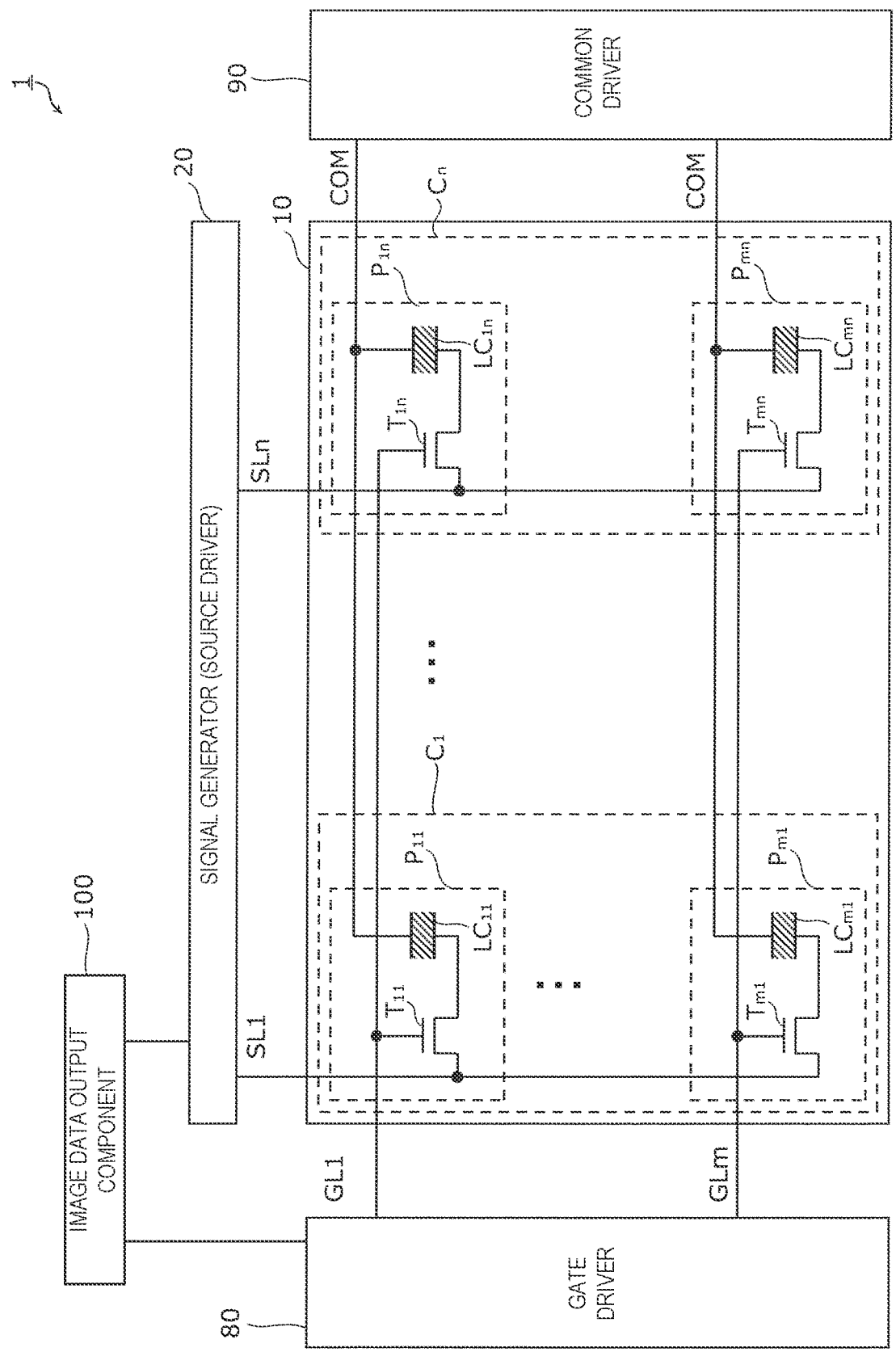
FIG. 3 is a schematic diagram illustrating the configuration of a liquid crystal display device in accordance with the first embodiment.

FIG. 3 is a schematic diagram illustrating the configuration of the liquid crystal display device 1 in accordance with the first embodiment.

As shown in FIG. 3, the liquid crystal display device 1 comprises the display panel 10, the signal generator (source driver) 20, a gate driver 80, a common driver 90, and an image data output component 100.

The display panel 10 has the plurality of pixels $P_{ij}$ (i=1 to m, j=1 to n). The pixels $P_{ij}$ are arranged in the form of a matrix, for example. The pixels $P_{ij}$ are made up of a plurality of pixel columns $C_j$. The pixels $P_{ij}$ include liquid crystals $LC_{ij}$ and switching elements $T_{ij}$, respectively. The liquid crystals $LC_{ij}$ are each configured such that a liquid crystal layer is formed between a common electrode and a pixel electrode. The common electrode is connected to a common wire COM. The pixel electrode is connected to the drain terminal of a switching elements $T_{ij}$. The switching elements $T_{ij}$ are TFTs (thin film transistors), for example. The switching elements $T_{ij}$ each include a gate terminal, a drain terminal, and a source terminal. The gate terminal is connected to a gate line GL. The drain terminal is connected to the pixel electrode of the liquid crystal $LC_{ij}$. The source terminal is connected to a wire (source line) SL. The pixels $P_{11}$ to $P_{mn}$ are pixels corresponding to red, green, and blue, respectively. A single pixel of an image is made up of three pixels $P_{ij}$. The display panel 10 can be a conventional display panel. Thus, the detailed description of the display panel 10 will be omitted for the sake of brevity.

The signal generator 20, the gate driver 80, and the common driver 90 are each made by a COF group including a plurality of COFs (chip-on-film). However, of course, the signal generator 20, the gate driver 80, and the common driver 90 can be made by different type of integrated circuits, and circuit boards, as needed and/or desired.

The signal generator 20 is an example of a drive circuit that produces a plurality of data signals corresponding to the gradation values of the pixel column $C_j$ (the pixels $P_{ij}$ to $P_{mj}$), and supplies the data signals to the pixel column $C_j$. The data signals are a drive signal. The signal generator 20 is connected to the pixel electrodes of the liquid crystals $LC_{11}$ to $LC_{mn}$ via the wires SL1 to $SL_n$ and the switching elements $T_{11}$ to $T_{mn}$. The signal generator 20 applies the data signals having voltage values corresponding to the pixel values of the selected pixel columns $C_j$, to the SL1 to $SL_n$.

The gate driver 80 is connected via gate lines GL1 to $GL_m$ to the switching elements $T_{11}$ to $T_{mn}$ forming the pixels $P_{11}$ to $P_{mn}$. Write processing is executed row by row at the display panel 10. The gate driver 80 applies to the gate line $GL_i$ of the selected pixel row a voltage for turning the switching elements $T_{i1}$ to $T_{in}$ forming the pixels $P_{i1}$ to $P_{in}$ connected to this gate line $GL_i$ in an ON state.

The common driver 90 is connected via the common wires COM to the common electrodes of the liquid crystals $LC_{11}$ to $LC_{mn}$. The common driver 90 applies a common voltage VCOM to the common wires COM.

The image data output component 100 analyzes a video signal and acquires gradation values for the pixels $P_{11}$ to $P_{mn}$. The image data output component 100 also outputs image data indicating the gradation values to the signal generator 20.

The configuration of the signal generator 20 in accordance with the first embodiment will now be described through reference to FIG. 4.

Figure 4:
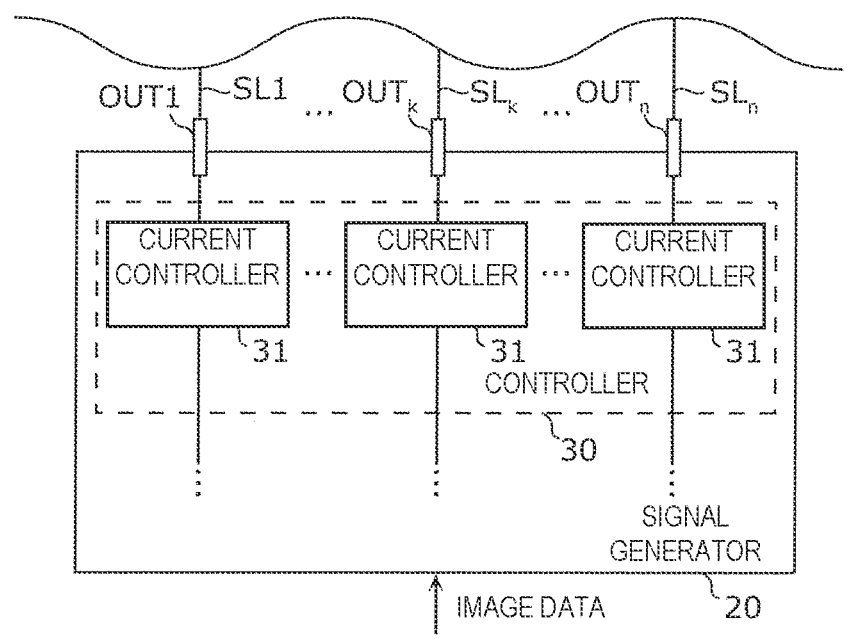
FIG. 4 is a schematic diagram of the configuration of a signal generator of the liquid crystal display device in accordance with the first embodiment.

FIG. 4 is a schematic diagram of the configuration of the signal generator 20 in accordance with the first embodiment.

The signal generator 20 produces data signals having voltages corresponding to the gradation values of the image data from the image data output component 100, for each of the pixels $P_{ij}$ to $P_{mj}$ included in the selected pixel columns $C_j$. The signal generator 20 applies the data signals thus produced to the input ends IN of the corresponding pixel column $C_j$ via a controller 30, the output ends OUT and the wires SL1 to $SL_n$. In other words, the signal generator 20 includes an electric circuit to output voltages (data signals) based on the gradation values of the image data from the image data output component 100.

In the illustrated embodiment, the signal generator 20 has the controller 30 that is built into the signal generator 20, for example. The controller 30 has current controllers 31 that are connected to the output ends OUT and vary the drive capability of the signal generator 20 at the output ends OUT. "Drive capability" refers to the drive capability required to achieve the desired operation at the load (pixels) connected to the output ends OUT. Herein, the drive capability of the signal generator 20 at the output ends OUT will also be called simply the drive capability. The current controllers 31 of the controller 30 vary the drive capability to vary the current waveforms corresponding to the data signals at the output ends OUT. As will be discussed in detail below, the controller 30 varies the current waveforms corresponding to the data signals at the output ends OUT to keep the values based on the voltages at the input ends IN (the input voltage waveform) within a specific range. Herein, the current waveforms corresponding to the data signals at the output ends OUT will also be called simply the current waveforms.

Figure 10A:
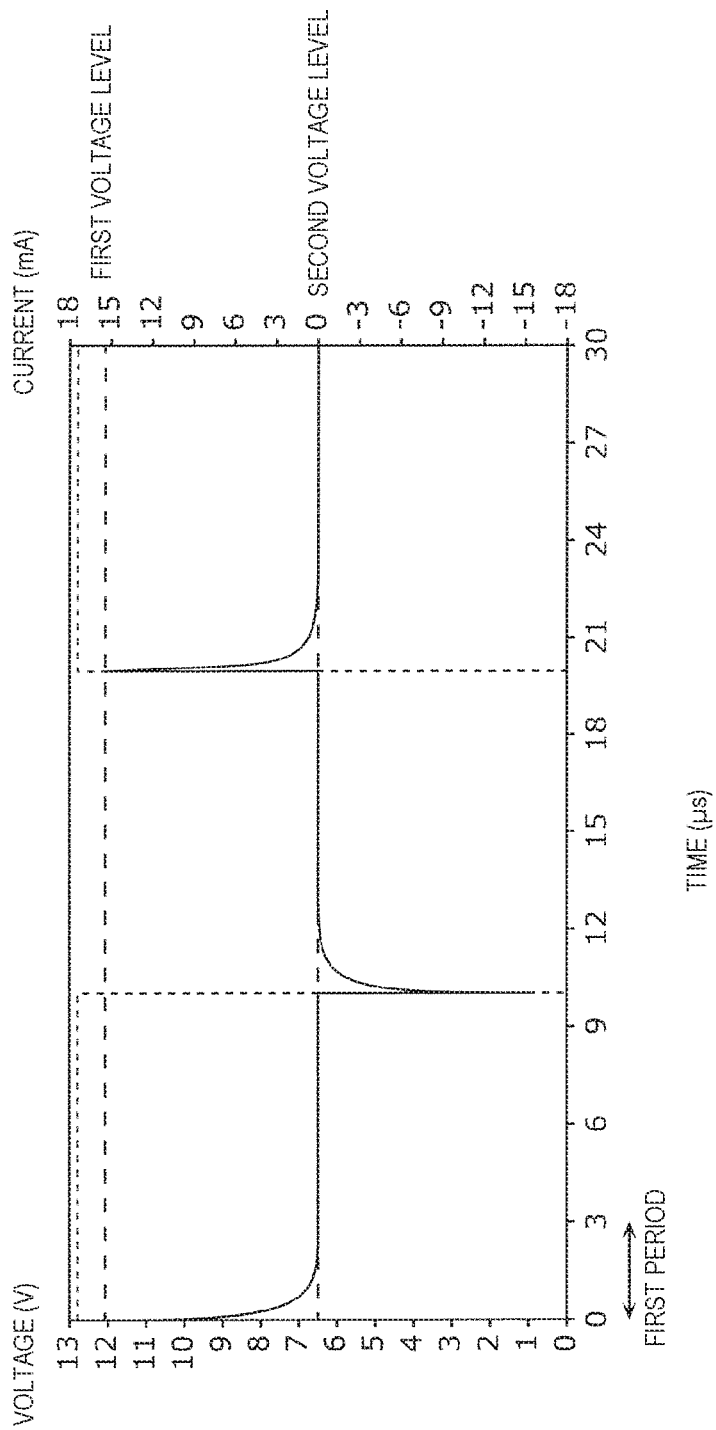
FIG. 10A shows the input voltage waveform at input ends and the current waveform at output ends when first circuits illustrated in FIG. 9 are connected to the output ends.
Figure 10B:
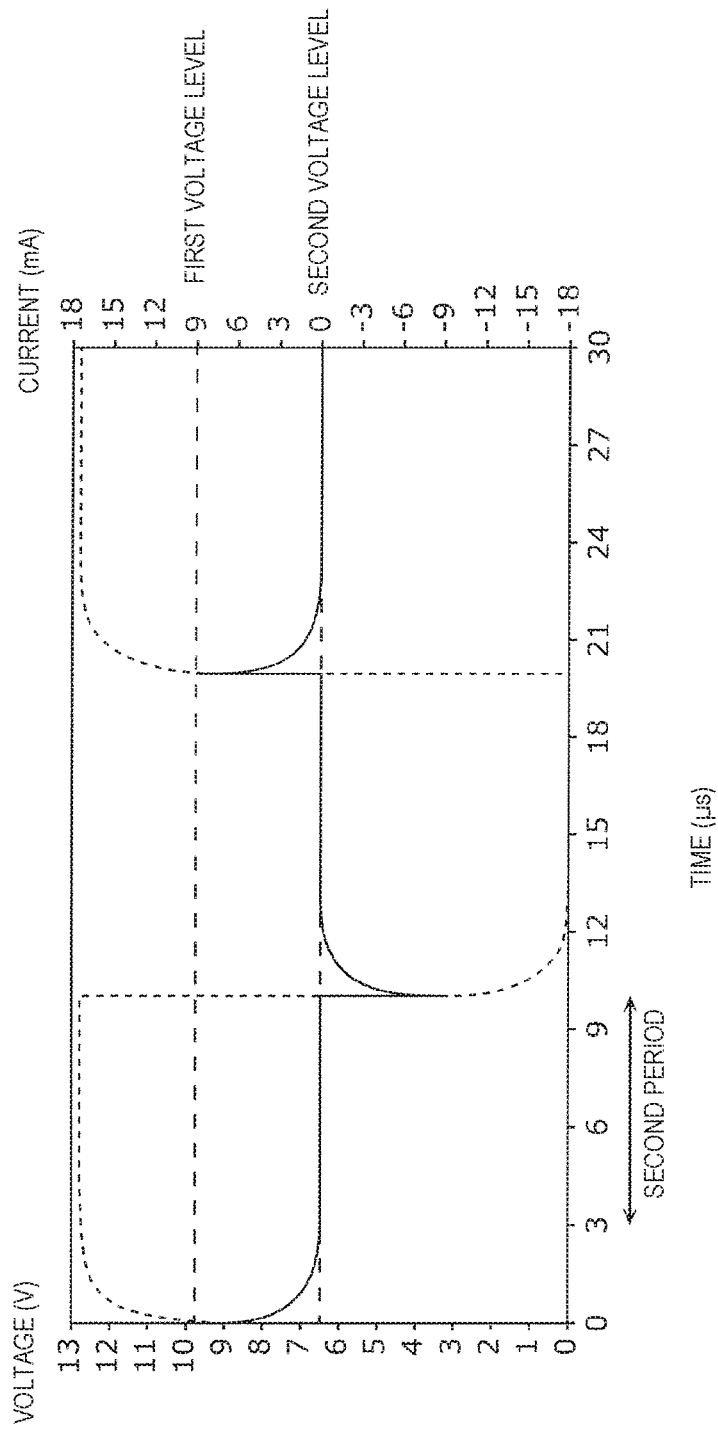
FIG. 10B shows the input voltage waveform at input ends and the current waveform at output ends when second circuits illustrated in FIG. 9 are connected to the output ends.

The longer is a wire SL connected to an output end OUT, the higher is the drive capability of a current controller 31 that is connected the output end OUT. If the drive capability is high, then the current waveform is changed to a waveform with a high current value at the start of the current flow according to the drive capability. For example, the current waveform is changed to the current waveform as shown in FIG. 10A that has a high current value compared to the current waveform in FIG. 10B (discussed below). Therefore, the input voltage waveform at the input end IN corresponding to the output end OUT (the input end IN corrected to the same wire SL as the output end OUT) tends not to become blunt with respect to the output voltage waveform at the output end OUT. If the drive capability is low, then the current waveform is changed to a waveform with a low current value at the start of the current flow according to the drive capability. For example, the current waveform is changed to the current wave form as shown in FIG. 10B that has a low current value compared to the current waveform in FIG. 10A (discussed below). Therefore, the input voltage waveform at the input end IN corresponding to the output end OUT tends to become blunt with respect to the output voltage waveform at the output end OUT. That is, the controller 30 (the current controllers 31) varies the drive capability (varies the current waveforms) at the output ends OUT, and thereby shaping the input voltage waveforms at the input ends IN corresponding to the output ends OUT.

In the illustrated embodiment, a circuit that lower the drive capability is connected as the current controller 31 in proportion to how short the wire SL is that is connected to the output end OUT. Consequently, the shorter is the wire SL connected to the output end OUT, the lower is the drive capability. Also, the shorter is the wire SL connected to the output end OUT corresponding to the input end IN, the more the input voltage waveform at the input end IN is blunted relative to the input voltage waveform at the input end IN without the connection of the current controllers 31. The circuits (current controllers 31) that lower the drive capability are circuits that include a resistor or a low-pass filter, for example, and are circuits that blunt the input voltage waveform at the input ends IN. The current controllers 31 are, for example, circuits that include only a resistor, circuits that include only a low-pass filter, or circuits that include both a resistor and a low-pass filter. Thus, in the illustrated embodiment, the current controllers 31 include an electric circuit or other electric component.

For example, as shown in FIG. 1, the output end $OUT_k$ is connected to the wire $SL_k$ with the shortest length. In this case, the current controller 31 that is connected to the output end $OUT_k$ lowers the drive capability the most out of the current controllers 31 that are connected to the output ends OUT. For example, when the current controllers 31 are circuits that include only a resistor, a resistor with a higher resistance is connected serially to the output end $OUT_k$. On the other hand, when the current controllers 31 are circuits that include only a low-pass filter, a low-pass filter with a lower blocking frequency is connected serially to the output end $OUT_k$.

For example, as shown in FIG. 1, the output end $OUT_n$ is connected to the wire $SL_n$ with the longest length. In this case, the current controller 31 that is connected to the output end $OUT_n$ has the highest drive capability out of the current controllers 31 that are connected to the output ends OUT. For example, when the current controllers 31 are circuits that include only a resistor, a resistor with a lower resistance is connected serially to the output end $OUT_n$. On the other hand, when the current controllers 31 are circuits that include only a low-pass filter, a low-pass filter with a higher blocking frequency is connected serially to the output end $OUT_n$. Alternatively, a current controller 31 need not be connected to the output end $OUT_n$. That is, the drive capability need not be lowered at the output end $OUT_n$. Furthermore, the wire SL1 has the same long length as the wire $SL_n$, and is connected to the output end OUT1. Thus, the current controller 31 that is connected to the output end OUT1 can also have the highest drive capability out of the current controllers 31 that are connected to the output ends OUT. Similarly, a current controller 31 need not be connected to the output end OUT1.

Figure 5:
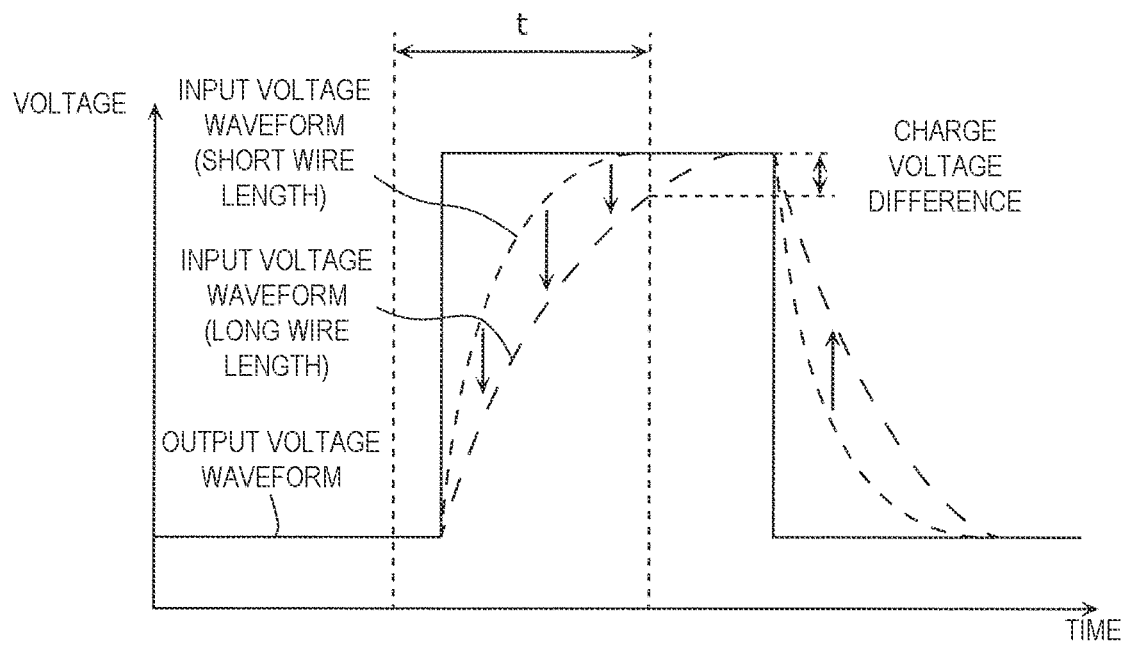
FIG. 5 is a diagram illustrating an example of the change in input voltage waveforms.

Referring now to FIG. 5, the input voltage waveform at the input end IN when the current controller 31 that lowers the drive capability is connected to the output end OUT to which the input end IN is connected via the wire SL of the short length will be described.

FIG. 5 shows an example of the change in the input voltage waveforms.

The input voltage waveform at the input end IN connected to the wire SL with the short length is changed by the current controller 31 that lowers the drive capability to a waveform that is blunted in the direction of the arrows shown in FIG. 5. On the other hand, the input voltage waveform at the input end IN connected to the wire SL with the long length either has little change in the waveform, or there is no change at all. For example, the current controller 31 that lowers the drive capability is connected to the output end OUT of the wire SL with the short length so that the input voltage waveform at the input end IN connected to the wire SL with the short length will approach the voltage waveform at the input end IN connected to the wire SL with the long length. More specifically, the current controllers 31 that lower the drive capability are connected to the output ends OUT2 to $OUT_{n-1}$ connected to the wires SL2 to $SL_{n-1}$ with a shorter length than the wire SL1 ($SL_n$) so that the input voltage waveforms at the input ends IN2 to $IN_{n-1}$ connected to the wires SL2 to $SL_{n-1}$ with a shorter length than the wire SL1 ($SL_n$) will approach the input voltage waveform at the input end IN1 ($IN_n$) connected to the wire SL1 ($SL_n$) with the longest length. That is, the current controllers 31 that lower the drive capability are connected to the output ends OUT2 to $OUT_{n-1}$ that are connected to the wires SL2 to $SL_{n-1}$ with a short length so that the input voltage waveform at the corresponding input ends IN2 to $IN_{n-1}$ will be blunted the same as at the input end IN1 ($IN_n$).

Thus, the current controllers 31 vary the drive capability, and thereby changing the input voltage waveform at the input ends IN closer to a specific voltage waveform. More specifically, the current controllers 31 change the input voltage waveforms at the input ends IN2 to $IN_{n-1}$ closer to the input voltage waveform at the input end IN1 ($IN_n$) connected to the wire SL1 ($SL_n$) with the longest length out of the wires SL, as the specific voltage waveform. That is, the input voltage waveforms at the input ends IN2 to $IN_{n-1}$ become substantially the same as the input voltage waveform at the input end IN1 ($IN_n$).

In the above-mentioned embodiment, the input voltage waveforms at the input ends IN can be blunted to obtain substantially the same waveforms. Thus, the charge voltages applied to the pixels $P_{ij}$ decrease overall. That is, there can be an overall decrease in the brightness and chromaticity seen by a viewer. In view of this, the signal generator 20 can have a configuration that is less prone to decreasing the overall brightness and chromaticity.

For example, the longer is the wire SL that is connected to an output end OUT, the more the circuit that is connected as the current controller 31 can raise the drive capability. In this case, the longer is the wire SL that is connected to an output end OUT, the higher is the drive capability. As a result, at the input end IN corresponding to the output end OUT, the less blunted is the input voltage waveform compared to the input voltage waveform without the connection of the current controller 31. The circuits that raise the drive capability (the current controllers 31) are circuits that include a buffer (e.g., a buffer amplifier), for example. Also, the circuits are circuits that reduce the blunting of the input voltage waveforms at the input ends IN. The current controllers 31 are circuits that include only a buffer, for example.

For instance, as shown in FIG. 1, a current controller 31 is connected to the output end $OUT_n$ that is connected to the wire $SL_n$ with the long length. This current controller 31 raises the drive capability at the output end $OUT_n$ the most out of the current controllers 31 that are connected to the output ends $OUT_k$ to $OUT_n$. For example, when the current controllers 31 are circuits that include only a buffer, a buffer with a higher drive capability is connected serially to the output end $OUT_n$. Furthermore, in the illustrated embodiment, the wire SL1 has the same long length as the wire $SL_n$. A current controller 31 is connected to the output end OUT1 connected to the long wire SL1. This current controller 31 raises the drive capability at the output end OUT1 the most out of the current controllers 31 that are connected to the output ends OUT1 to $OUT_k$.

Furthermore, as shown in FIG. 1, a current controller 31 is connected to the output end $OUT_k$ connected to the wire $SL_k$ with the short length. This current controller 31 lowers the drive capability at the output end $OUT_k$ of the signal generator 20 the most out of the current controllers 31 that are connected to the output ends $OUT_k$ to $OUT_n$. For example, when the current controllers 31 are circuits that include only a buffer, a buffer with a lower drive capability is connected serially to the output end $OUT_k$. Furthermore, alternatively, a current controller 31 need not be connected to the output end $OUT_k$. That is, the drive capability need not be raised at the output end $OUT_k$.

Figure 6:
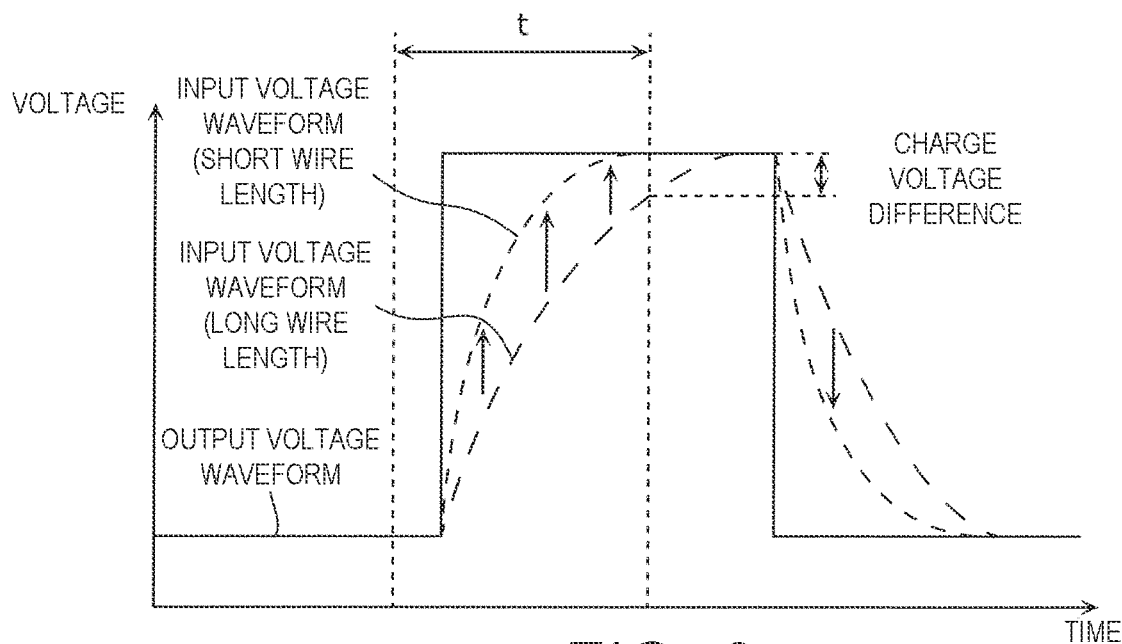
FIG. 6 is a diagram illustrating another example of the change in input voltage waveforms.

Referring not to FIG. 6, the input voltage waveform at the input end IN when the current controller 31 that raises the drive capability is connected to the output end OUT to which the input end IN is connected via the wire SL of the long length will now be described.

FIG. 6 shows another example of the change in the input voltage waveforms.

The input voltage waveform at the input end IN connected to the wire SL with the long length is changed by the current controller 31 that raises the drive capability to a waveform that is less blunted in the direction of the arrows shown in FIG. 6. On the other hand, the input voltage waveform at the input end IN connected to the wire SL with the short length either has little change in the waveform, or there is no change at all. For example, the current controller 31 that raises the drive capability is connected to the output end OUT of the wire SL with the long length so that the input voltage waveform at the input end IN connected to the wire SL with the long length will approach the voltage waveform at the input end IN connected to the wire SL with the short length. More specifically, the current controllers 31 that raise the drive capability are connected to the output ends OUT1 to $OUT_{k-1}$ and $OUT_{k+1}$ to $OUT_n$ connected to wires SL1 to $SL_{k-1}$ and $SL_{k+1}$ to $SL_n$ with a longer length than the wire $SL_k$ so that the input voltage waveforms at the input ends IN1 to $IN_{k-1}$ and $IN_{k+1}$ to $IN_n$ connected to the wires SL1 to $SL_{k-1}$ and $SL_{k+1}$ to $SL_n$ with a longer length than the wire $SL_k$ will approach the input voltage waveform at the input end $IN_k$ connected to the wire $SL_k$ with the shortest length out of the wires SL. That is, the current controllers 31 that raise the drive capability are connected to the output ends OUT1 to $OUT_{k-1}$ and $OUT_{k+1}$ to $OUT_n$ connected to wires SL1 to $SL_{k-1}$ and $SL_{k+1}$ to $SL_n$ with a long length so that the input voltage waveform at the corresponding input ends IN1 to $IN_{k-1}$ and $IN_{k+1}$ to $IN_n$ will tend not to be blunted the same as at the input end $IN_k$.

Thus, the current controllers 31 vary the drive capability, and thereby changing the input voltage waveform at the input ends IN closer to a specific voltage waveform. More specifically, the current controllers 31 change the input voltage waveforms at the input ends IN1 to $IN_{k-1}$ and $IN_{k+1}$ to $IN_n$ closer to the input voltage waveform at the input end $IN_k$ connected to the wire $SL_k$ with the shortest length out of the wires SL, as the specific voltage waveform. That is, the input voltage waveforms at the input ends IN1 to $IN_{k-1}$ and $IN_{k+1}$ to $IN_n$ all become substantially the same as the input voltage waveform at the input end $IN_k$.

In this case, the input voltage waveforms at the input ends IN are substantially the same voltage waveform in a state of little blunting. Thus, the charge voltages applied to the pixels $P_{ij}$ will not decrease overall. That is, this makes it less likely that there is an overall decrease in the brightness seen by a viewer.

The controller 30 varies the drive capability (varies the current waveforms), and thereby keeping the values based on the voltage at the input ends IN (the input voltage waveform) within a specific range, so that the input voltage waveforms at the input ends IN will be substantially the same input voltage waveforms. Here, the values based on the voltage at the input ends IN is a difference between chromaticity coordinates in any two regions of the display panel 10 while suppling the data signals corresponding to a specific gradation (e.g., the same gradation) to the pixels $P_{ij}$, for example. "Any two regions" refers to two of the plurality of regions in the display panel 10 in which chromaticity coordinates are measured by a color analyzer or the like, for example. The chromaticity coordinates have an x coordinate and a y coordinate. The difference in the chromaticity coordinates is the difference between the x coordinates and/or the difference between the y coordinates in any two regions. "Values within a specific range" refers to a difference in chromaticity coordinates (a difference between x coordinates or a difference between y coordinates) that is small enough to be unnoticeable by a viewer.

Figure 7A:
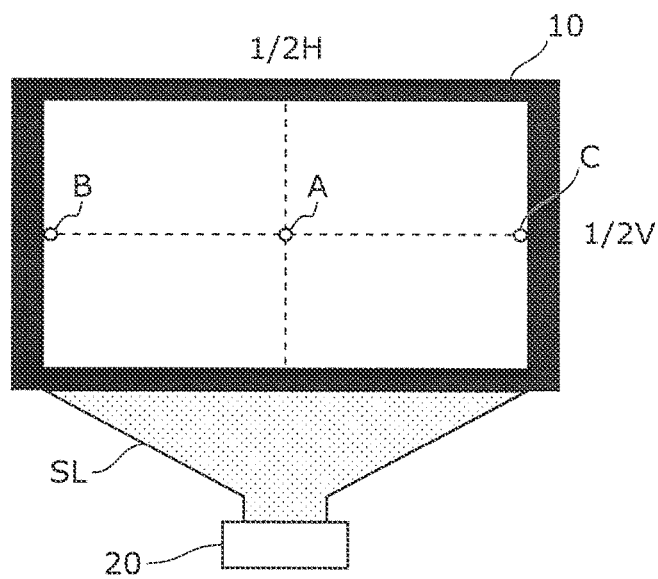
FIG. 7A is a schematic diagram of the configuration of the liquid crystal display device, illustrating the method for measuring chromaticity coordinates when there is one signal generator.
Figure 7B:
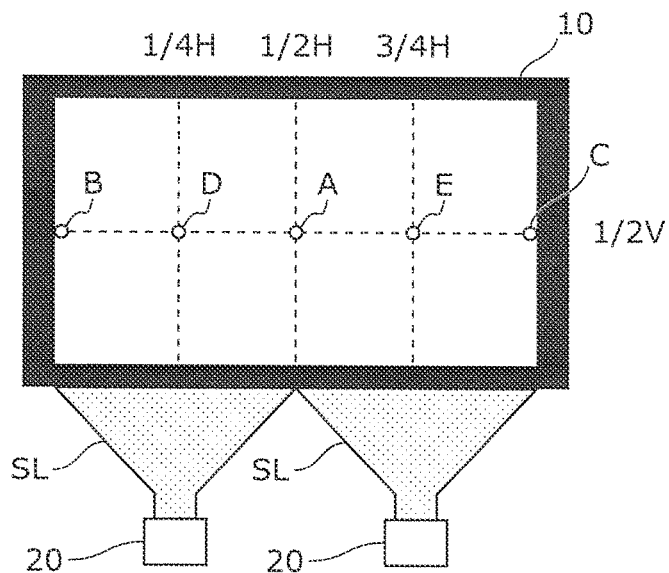
FIG. 7B is a schematic diagram of the configuration of the liquid crystal display device, illustrating the method for measuring chromaticity coordinates when there are two signal generators.

In the illustrated embodiment, as shown in FIG. 1, one signal generator 20 is connected to the display panel 10. However, a plurality of signal generators 20 can be connected to the display panel 10. The regions in which the chromaticity coordinates are measured will vary with the number of signal generators 20 connected to the display panel 10. Referring now to FIGS. 7A and 7B, a method for measuring the chromaticity coordinates in a plurality of regions when there is one or two signal generators 20 will now be described.

FIG. 7A is a diagram illustrating the method for measuring chromaticity coordinates when there is one signal generator 20.

When just one signal generator 20 is connected to the display panel 10, the regions in which chromaticity coordinates are measured are regions A to C shown in FIG. 7A, for example. Region A is a region that includes a pixel that corresponds to the shortest wire $SL_k$ out of the wires SL connected to the one signal generator 20 (the pixel at the ½H line shown in FIG. 7A), and is located at the center in the vertical direction of the display panel 10 (the pixel at the ½V line shown in FIG. 7A). Region B is a region that includes a pixel that corresponds to the longest wire SL1 out of the wires SL connected to the one signal generator 20, and is located at the center in the vertical direction of the display panel 10. Region C is a region that includes a pixel that corresponds to the longest wire $SL_n$ out of the wires SL connected to the one signal generator 20, and is located at the center in the vertical direction of the display panel 10. That is, the chromaticity coordinates are measured in the regions that include the pixels corresponding to the shortest wire $SL_k$ and the longest wires SL1 and $SL_n$. The controller 30 then keeps the differences between the chromaticity coordinates of the regions A and B, and between the chromaticity coordinates of the regions A and C (the differences between x coordinates or the differences between y coordinates), as any two regions among regions A to C, within a specific range. That is, the controller 30 keeps the differences between the chromaticity coordinate in the region that includes the pixel corresponding to the shortest wire $SL_k$ and the chromaticity coordinates in the regions that include the pixel corresponding to the longest wires SL1 and $SL_n$ as a value within a specific range. In this embodiment, the controller 30 keeping the difference in the chromaticity coordinates in any two regions as the value within the specific range refers to, for example, that the current controllers 31 are connected to the output ends OUT so that the difference in the chromaticity coordinates in any two regions will be the value within the specific range.

FIG. 7B is a diagram illustrating the method for measuring chromaticity coordinates when there are two signal generators 20 (e.g., left and right signal generators 20).

When the two signal generators 20 are connected to the display panel 10, the regions in which chromaticity coordinates are measured are regions A to E shown in FIG. 7B, for example. Region A is a region that includes a pixel that corresponds to the longest wire $SL_n$ out of the wires SL connected to the left signal generator 20 on the left side in FIG. 7B, and includes a pixel that corresponds to the longest wire SL1 out of the wires SL connected to the right signal generator 20 on the right side in FIG. 7B (i.e., pixels at the ½H line shown in FIG. 7B). Also, these pixels in region A are located at the center in the vertical direction of the display panel 10 (the pixel at the ½V line shown in FIG. 7B). Region B is a region that includes a pixel that corresponds to the longest wire SL1 out of the wires SL connected to the left signal generator 20, and is located at the center in the vertical direction of the display panel 10. Region C is a region that includes a pixel that corresponds to the longest wire $SL_n$ out of the wires SL connected to the right signal generator 20, and is located at the center in the vertical direction of the display panel 10. Region D is a region that includes a pixel that corresponds to the shortest wire $SL_k$ out of the wires SL connected to the left signal generator 20 (a pixel on the ¼H line shown in FIG. 7B), and is located at the center in the vertical direction of the display panel 10. Region E is a region that includes a pixel that corresponds to the shortest wire $SL_k$ out of the wires SL connected to the right signal generator 20 (a pixel on the ¾H line shown in FIG. 7B), and is located at the center in the vertical direction of the display panel 10. That is, for each of the signal generators 20, the chromaticity coordinates are measured in the regions that include the pixels corresponding to the shortest wire $SL_k$ and the longest wires SL1 and $SL_n$. The controller 30 then keeps the differences between the chromaticity coordinates in the regions D and A, between the chromaticity coordinates in the regions D and B, between the chromaticity coordinates in the regions E and A, and between the chromaticity coordinates in the regions E and C (the differences between x coordinates or the differences between y coordinates), as any two regions among regions A to E, within a specific range. That is, for each of the signal generators 20, the controller 30 keeps the differences between the chromaticity coordinate in the region that include the pixel corresponding to the shortest wire $SL_k$ and the chromaticity coordinates in the regions that include the pixels corresponding to the longest wires SL1 and $SL_n$ as a value within a specific range.

Similarly, when three or more signal generators 20 are connected to the display panel 10, the chromaticity coordinates are measured in regions that include pixels corresponding to the shortest wire $SL_k$ and the longest wires SL1 and $SL_n$ connected to each of the signal generators 20. The controller 30 then keeps the difference between the chromaticity coordinate in the region that includes the pixel corresponding to the shortest wire $SL_k$ and the chromaticity coordinates in the regions that include the pixels corresponding to the longest wires SL1 and $SL_n$ as a value within a specific range for each of the signal generators 20.

In the illustrated embodiment, the display panel 10 has a rectangular shape as shown in FIGS. 7A and 7B. In the illustrated embodiment, as shown in FIGS. 7A and 7B, the wires SL are connected to the display panel 10 at a long side of the display panel 10. However, the liquid crystal display device 1 can be configured such that the wires SL are connected to the display panel 10 at a short side of the display panel 10. In particular, the liquid crystal display device 1 can be configured such that a single set of wires SL is connected to the display panel 10 at the short side of the display panel 10, or such that two sets of wires SL are connected to the display panel 10 at the short side of the display panel.

In the illustrated embodiment, as shown in FIGS. 7A and 7B, one of the wires SL (e.g., the longest wires SL1 and $SL_n$ in FIG. 7A, the longest wire SL1 connected to the left signal generator 20 in FIG. 7B, the longest wire $SL_n$ connected to the right signal generator 20 in FIG. 7B) that is connected to one of the input ends IN located closest to a corner of the display panel 10 is the longest among the wires SL.

Also, in the illustrated embodiment, as shown in FIGS. 7A and 7B, one of the wires SL (e.g., the longest wires SL1 and $SL_n$ in FIG. 7A, the longest wire SL1 connected to the left signal generator 20 in FIG. 7B, the longest wire $SL_n$ connected to the right signal generator 20 in FIG. 7B) that is connected to one of the input ends IN located closest to an end of the long side of the display panel 10 is the longest among the wires SL.

Also, in the illustrated embodiment, as shown in FIG. 7B, one of the wires SL (e.g., the longest wire $SL_n$ connected to the left signal generator 20, the longest wire SL1 connected to the right signal generator 20) that is connected to one of the input ends IN located closest to the center of a side of the display panel 10 (e.g., the ½H line shown in FIG. 7B) is the longest among the wires SL. Specifically, one of the wires SL (e.g., the longest wire $SL_n$ connected to the left signal generator 20, the longest wire SL1 connected to the right signal generator 20) that is connected to one of the input ends IN located closest to the center of the long side of the display panel 10 (e.g., the ½H line shown in FIG. 7B) is the longest among the wires SL. Alternatively, when the wires SL are connected to the display panel 10 at the short side of the display panel 10, one of the wires SL (e.g., the longest wire $SL_n$ connected to the left signal generator 20, the longest wire SL1 connected to the right signal generator 20) that is connected to one of the input ends IN located closest to the center of the short side of the display panel 10 (e.g., the ½V line shown in FIG. 7B) is the longest among the wires SL.

An example of the values within the specific range will now be described through reference to FIG. 8.

Figure 8:
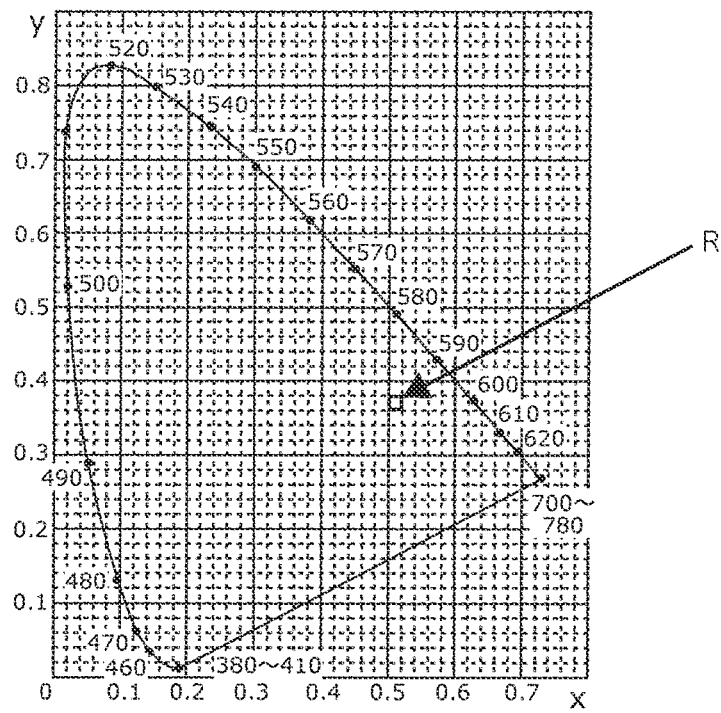
FIG. 8 shows an xy chromaticity diagram, illustrating an example of a specific range on the xy chromaticity diagram.

FIG. 8 shows an xy chromaticity diagram, illustrating an example of a specific range on the xy chromaticity diagram. In FIG. 8, the chromaticity of the display panel 10 is shown in the xy chromaticity diagram. The xy chromaticity diagram is CIE 1931 color space chromaticity diagram, in the illustrated embodiment.

For example, in the illustrated embodiment, the data signal is supplied to each of the pixels based on a specific gradation expressed in eight bits. When data corresponding to a gradation of "red: 255, green: 127, blue: 76" is supplied as the specific gradation, the x coordinate of the chromaticity coordinate is approximately 0.509, and the y coordinate is approximately 0.375. In the illustrated embodiment, the controller 30 keeps at least one of (both, in the illustrated embodiment) the difference between the x coordinates and the difference between the y coordinates in any two regions within a specific range that is at least 0 and no more than 0.03 (i.e., more than or equal to 0 and less than or equal to 0.03). Preferably, the specific range is at least 0 and no more than 0.02. More specifically, if the x coordinate is 0.509 and the y coordinate is 0.375 in one of any two regions, then the controller 30 sets the x coordinate in the other region to 0.509±0.03 (preferably, 0.509±0.02), and the y coordinate to 0.375±0.03 (preferably, 0.375±0.02), as in the range R indicated by the thick-line rectangle in FIG. 8. In the illustrated embodiment, the current controllers 31 are selectively installed according to the lengths of the wires SL to keep the difference in the chromaticity coordinates within the specific range.

Thus, in the illustrated embodiment, the controller 30 can keep the value based on the voltages at the input ends IN within the specific range.

As discussed above, with the liquid crystal display device 1 in accordance with the first embodiment, the current controllers 31 are connected to the output ends OUT so that the longer is the wire SL that is connected to an output end OUT, the higher is the drive capability at the output end OUT. In other words, with the liquid crystal display device 1 in accordance with the first embodiment, the output ends OUT are connected to the current controllers 31 so that the shorter is the wire SL that is connected to an output end OUT, the lower is the drive capability at the output end OUT. Therefore, the input voltage waveform that is changed according to the drive capability (i.e., the current waveform according to the drive capability) can be changed closer to the desired waveform. For example, the current controllers 31 that lower the drive capability are connected to the corresponding output ends OUT so that the input voltage waveforms at the input ends IN will be substantially the same. That is, the current controllers 31 that lower the drive capability are connected to the corresponding output ends OUT so that the values based on the voltages at the input ends IN will fall within a specific range. Alternatively, the current controllers 31 that raise the drive capability are connected to the corresponding output ends OUT so that the input voltage waveforms at the input ends IN will be substantially the same. That is, the current controllers 31 that raise the drive capability are connected to the corresponding output ends OUT so that the values based on voltages at the input ends IN will fall within a specific range. Consequently, the drive capability at corresponding output ends OUT can be varied (the current waveform can be varied) so as to reduce variance in the input voltage waveform at the input ends IN that results from the difference in the lengths of the wires SL. Thus, it is less likely that there will be variance in the brightness and chromaticity due to the difference in the lengths of the wires SL connecting the signal generator 20 and the display panel 10.

In the illustrated embodiment, the liquid crystal display device 1 includes the display panel 10, the signal generator 20, the wires SL and the controller 30. The display panel 10 has the pixels $P_{ij}$. The signal generator 20 is configured to supply the data signals to the pixels $P_{ij}$. The wires SL connect the output ends OUT of the signal generator 20 to the input ends IN of the pixels $P_{ij}$, respectively. The controller 30 is configured to vary at least one of the voltage waveform and the current waveform corresponding to the data signals at the output ends OUT according to the lengths of the wires SL.

In the illustrated embodiment, the controller 30 is configured to vary at least one of the voltage waveform and the current waveform such that the difference in the chromaticity coordinates in any two regions on the display panel 10 falls within the specific range while supplying the data signal corresponding to the specific gradation to the pixels $P_{ij}$.

In the illustrated embodiment, the chromaticity coordinates each have the x coordinate and the y coordinate. The controller 30 is configured to vary at least one of the voltage waveform and the current waveform such that at least one of the difference in the x coordinates and the difference in the y coordinates in the two regions falls within the range that is more than or equal to 0 and less than or equal to 0.03. Preferably, the controller 30 is configured to vary at least one of the voltage waveform and the current waveform such that at least one of the difference in the x coordinates and the difference in the y coordinates in the two regions falls within the range that is more than or equal to 0 and less than or equal to 0.02.

Second Embodiment

Referring now to FIGS. 9 to 13B, a liquid crystal display device 1 in accordance with a second embodiment will now be explained. In view of the similarity between the first and second embodiments, the parts of the second embodiment that are identical to the parts of the first embodiment will be given the same reference numerals as the parts of the first embodiment. Moreover, the descriptions of the parts of the second embodiment that are identical to the parts of the first embodiment may be omitted for the sake of brevity.

With the above-mentioned liquid crystal display device 1 in accordance with the first embodiment, the low-pass filters, the buffers, or other such current controllers 31 reduce variance in the input voltage waveform at the input ends IN. The current controllers 31 are built into the signal generator 20 and are connected to the output ends OUT. In particular, the current controllers 31 are prepared for a particular display panel 10 in which the lengths of the wires SL are determined in advance. Therefore, the signal generator 20 ends up being a dedicated part. This makes it difficult to use the signal generator 20 in multiple types of display panels 10 with different sizes (e.g., different pitches of the input ends IN), for example.

The liquid crystal display device 1 in accordance with the second embodiment is basically identical to the liquid crystal display device 1 in accordance with the first embodiment, except that it includes a signal generator 20a instead of the signal generator 20. The rest of the configuration is the same as in the first embodiment, and therefore will not be described again.

Figure 9:
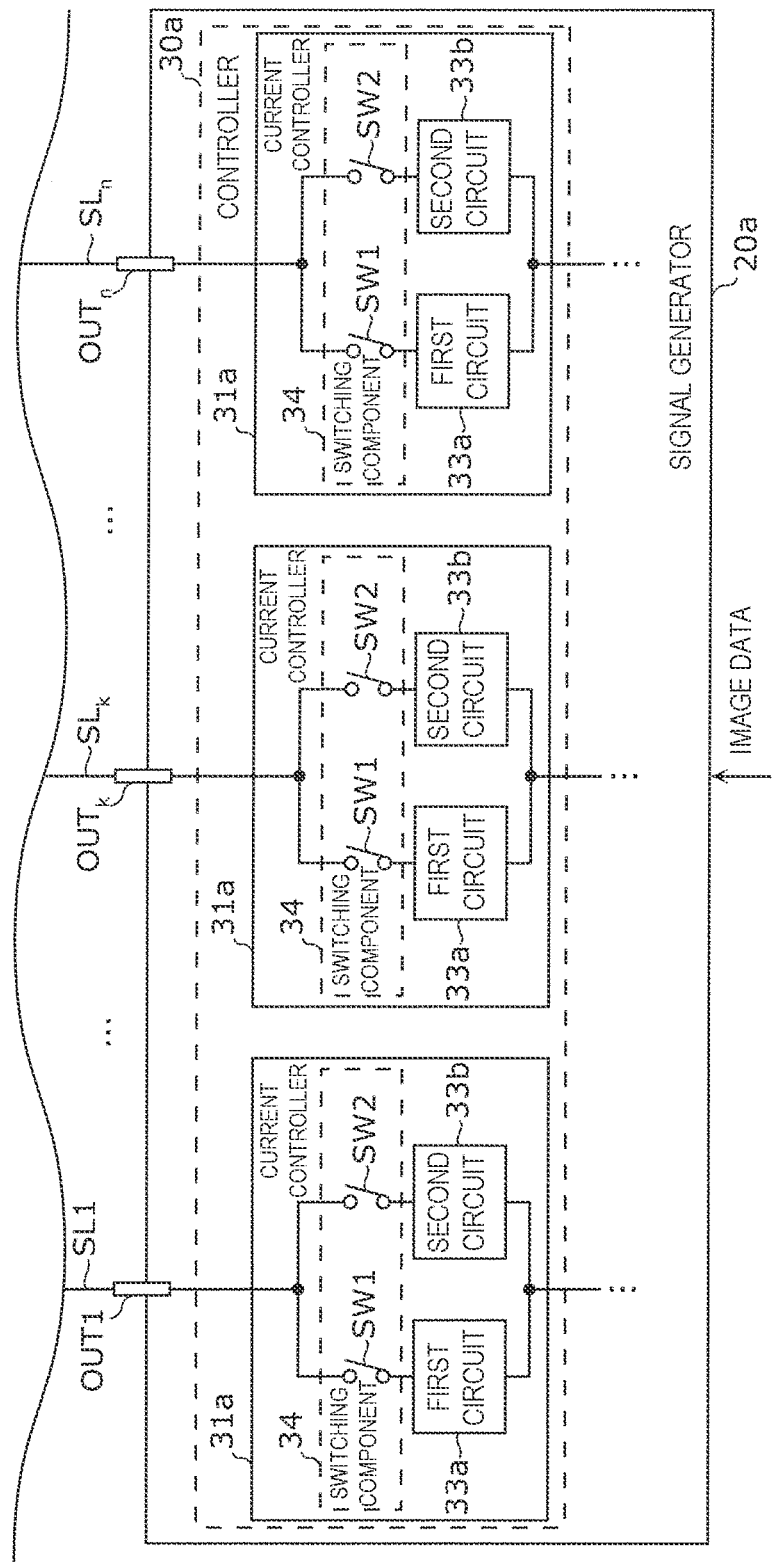
FIG. 9 is a schematic diagram illustrating the configuration of a signal generator of a liquid crystal display device in accordance with a second embodiment.

FIG. 9 is a schematic diagram illustrating the configuration of the signal generator 20a in accordance with the second embodiment.

The signal generator 20a produces data signals having voltages corresponding to the gradation values of the image data from the image data output component 100, for each of the pixels $P_{ij}$ to $P_{mj}$ included in the selected pixel columns $C_j$. The signal generator 20a applies the various data signals thus produced to the input ends IN of the corresponding pixel columns $C_j$ via a controller 30a, the output ends OUT, and the wires SL1 to $SL_n$.

In the illustrated embodiment, the signal generator 20a has the controller 30a that is built into the signal generator 20a, for example. The controller 30a has current controllers 31a that are connected to the output ends OUT and vary the drive capability of the signal generator 20a at the output ends OUT. The current controllers 31a of the controller 30a vary the drive capability to vary the current waveforms corresponding to the data signals at the output ends OUT. The controller 30a varies the current waveforms corresponding to the data signals at the output ends OUT to keep the values based on the voltages at the input ends IN (input voltage waveforms) within a specific range. In the illustrated embodiment, the current controllers 31a each include a first circuit 33a, a second circuit 33b, and a switching component 34 (e.g., switch) for varying the drive capability (varying the current waveforms).

As shown in FIG. 9, the first circuits 33a and the second circuits 33b are connected to the output ends OUT. The first circuits 33a and the second circuits 33b are circuits that raise and/or lower the drive capability. The first circuits 33a and the second circuits 33b are provided to the output ends OUT, respectively.

The switching components 34 each have a switch SW1 and a switch SW2. The switches SW1 are connected serially to the first circuits 33a, respectively. The switches SW2 are connected serially to the second circuits 33b, respectively. In each of the current controllers 31a, the first circuit 33a and the serially connected switch SW1 are connected in parallel with the second circuit 33b and the serially connected switch SW2. The switching components 34 each selectively switch between a connection between the first circuit 33a and the output end OUT and a connection between the second circuit 33b and the output end OUT, in the order of the first circuit 33a first and then the second circuit 33b, during the period t in which the signal generator 20a supplies the data signals to the pixels. At this point, the switching components 34 perform the switching by controlling the switches SW1 and the switches SW2. That is, the switching components 34 connect the first circuits 33a to the output ends OUT by switching on the switches SW1 and switching off the switches SW2, and then connect the second circuits 33b to the output ends OUT by switching off the switches SW1 and switching on the switches SW2.

Also, the drive capability when the switching components 34 have connected the first circuits 33a to the output ends OUT is higher than the drive capability when the switching components 34 have connected the second circuits 33b to the output ends OUT. For example, when the first circuits 33a and the second circuits 33b are circuits that lower the drive capability, the second circuits 33b lower the drive capability at the output ends OUT more than the first circuits 33a do. On the other hand, for example, when the first circuits 33a and the second circuits 33b are circuits that raise the drive capability, the first circuits 33a raise the drive capability at the output ends OUT more than the second circuits 33b do. Alternatively, the first circuits 33a and the second circuits 33b can be configured such that the first circuits 33a are circuits that raise the drive capability, and the second circuits 33b are circuits that lower the drive capability. The drive capability needs to be higher during the rise of the input voltage waveform than during the fall. Thus, the switching components 34 connect the first circuits 33a with which the drive capability is higher at the output ends OUT before the second circuits 33b.

Referring now to FIGS. 10A and 10B, the current waveforms at the output end OUT and the input voltage waveforms at the input end IN when just the first circuit 33a is connected to the output end OUT and when just the second circuit 33b is connected to the output end OUT will now be described.

FIG. 10A shows an example of the input voltage waveform at the input end IN and the current waveform at the output end OUT when the first circuits 33a is connected to the output end. The solid line is the current waveform, and the broken line is the input voltage waveform. FIG. 10A illustrates the waveforms while the switch SW1 is left on and the switch SW2 is left off.

FIG. 10B shows an example of the input voltage waveform at the input end IN and the current waveform at the output end OUT when the second circuit 33b is connected to the output end OUT. The solid line is the current waveform, and the broken line is the input voltage waveform. FIG. 10B illustrates the waveforms while the switch SW2 is left on and the switch SW1 is left off. FIGS. 10A and 10B show the input voltage waveforms at the input end IN and the current waveforms at the output end OUT for the same load (pixels).

The first circuits 33a are circuits with which the drive capability at the output ends OUT is higher than with the second circuits 33b. Thus, when the first circuit 33a is connected to the output end OUT, the current waveform at the output end OUT is a waveform in which the current value is large at the start of the current flow, and in which the input voltage waveform at the input end IN has little bluntness.

On the other hand, the second circuits 33b are circuits with which the drive capability at the output ends OUT is lower than with the first circuits 33a. Thus, when the second circuit 33b is connected to the output end OUT, the current waveform at the output end OUT is a waveform in which the current value is small at the start of the current flow, and in which the input voltage waveform at the input end IN is blunted.

In the illustrated embodiment, the first circuits 33a and the second circuits 33b are selectively connected to the output ends OUT. The switching components 34 perform control so that the longer is the wire SL that is connected to an output end OUT, the longer is a first period during which the first circuit 33a is connected to the output end OUT in the period t with respect to a second period during which the second circuit 33b is connected to the output end OUT. Also, the switching components 34 perform control so that the shorter is the wire SL, the longer is the second period with respect to the first period in the period t. For example, for the wires SL with the short length that are connected to the output ends OUT and the input ends IN, the current waveforms at these output ends OUT will be a current waveform in which the current waveform at the first period shown in FIG. 10A is linked to the current waveform at the second period shown in FIG. 10B, which is longer than that first period. Similarly, for the wires SL with the long length that are connected to the output ends OUT and the input ends IN, the current waveforms at these output ends OUT will be a current waveform (not shown in the drawings) in which that links the current waveform at the first period, which is longer than the second period, to the current waveform at the second period.

In the illustrated embodiment, the current waveform thus produced includes a first current level and a second current level that is lower than the first current level. The controller 30a (the current controllers 31a) varies the first current level according to the lengths of the wires SL. As shown in FIGS. 10A and 10B, the first current level is the current value at the start of the current flow in the current waveforms at the output ends OUT, and the second current level is the current value when the current flow has stopped (that is, substantially zero) in the current waveforms at the output ends OUT.

The first current level at an output end OUT connected to a wire SL of a specific length out of the wires SL is higher than the first current level at an output end OUT connected to a wire SL that is shorter than the specific length while supplying the data signal corresponding to a specific gradation (e.g., the same gradation) to the pixels. Thus, in the illustrated embodiment, the controller 30a is configured to vary the first current level such that the first current level at one of the output ends OUT connected to one of the wires that has the specific length (e.g., a long wire SL) is higher than the first current level at another one of the output ends OUT connected to another one of the wires that is shorter than the specific length (e.g., a short wire SL) while supplying the data signal corresponding to the specific gradation to the pixels. This "wire SL of a specific length" refers to the longer wire SL when the lengths of any two wires SL out of the wires SL are compared with respect to each other. Thus, the current controllers 31a output current waveforms of different first current levels from the output ends OUT according to the wire length. More specifically, the longer is the wire SL, the less current tends to flow. Thus, the current controller 31a increases the first current level to be the first current level in the current waveform shown in FIG. 10A. On the other hand, the shorter is the wire SL, the more current tends to flow. Thus, the current controller 31a reduces the first current level to be the first current level in the current waveform shown in FIG. 10B. Consequently, the input voltage waveforms at the input ends IN connected to the wires SL of the specific length have little bluntness while the current waveform with the higher first current level being supplied, as with the input voltage waveforms at the input ends IN connected to the wires SL that are shorter than the specific length. Therefore, the controller 30a can keep the values based on the voltages at the input ends IN within a specific range. In particular, the controller 30a can keep the values based on the voltages at the input ends IN within the specific range that is explained in the first embodiment by referring to FIG. 8. Thus, it is less likely that there will be variance in the brightness and chromaticity due to the differences in the lengths of the wires SL connecting the signal generator 20a and the display panel 10.

In the illustrated embodiment, the total of the first period and the second period is the period t. The ratio of the first period and second period to the period t is changed according to the wire length. The switching components 34 perform control according to the predetermined correlation between the wire length and the optimal first and second periods (i.e., the optical time lengths of the first period and the second period). Information about this correlation is stored in a memory component (not shown) provided to the liquid crystal display device 1 in accordance with the second embodiment, for example. The switching components 34 perform the control by referring to this correlation. The predetermined correlation between the wire length and the optimal first and second periods will now be described through reference to FIG. 11.

Figure 11:
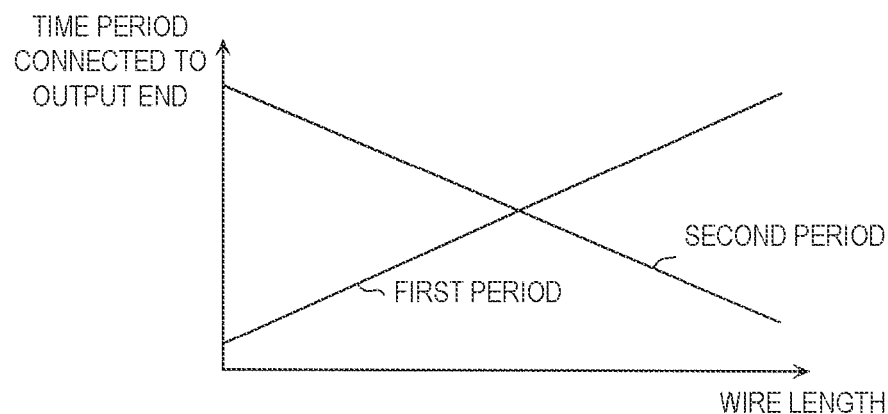
FIG. 11 is a diagram illustrating a predetermined correlation between wire length and optimal first and second periods.

FIG. 11 shows an example of the predetermined correlation between wire length and the optimal first and second periods.

As shown in FIG. 11, the longer is the wire SL that is connected to an output end OUT, the longer the switch SW1 provided to the output end OUT is left on by the switching component 34 in the period t, and the shorter the switch SW2 is left on in the period t. Also, the shorter is the wire SL that is connected to the output end OUT, the shorter the switch SW1 provided to the output end OUT is left on by the switching component 34 in the period t, and the longer the switch SW2 is left on in the period t. The drive capability at the output ends OUT here will be described through reference to FIGS. 12A and 12B.

Figure 12A:
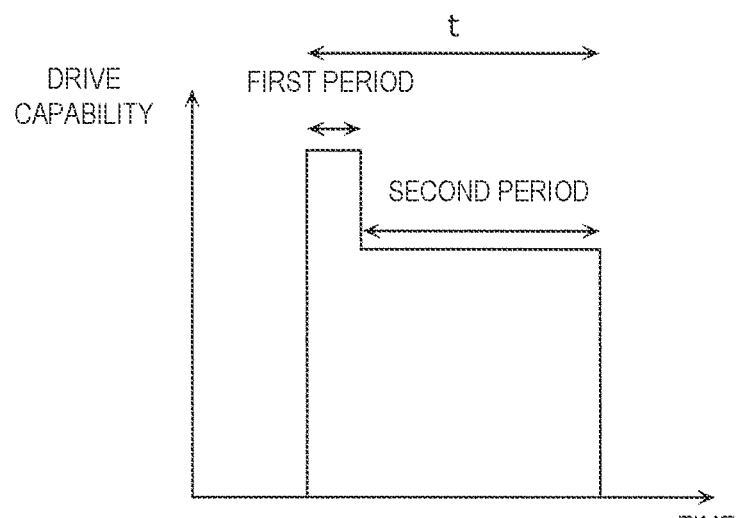
FIG. 12A is a diagram illustrating an example of drive capability at an output end connected to a short wire.

FIG. 12A shows an example of the drive capability at an output end OUT connected to a short wire SL.

Figure 12B:
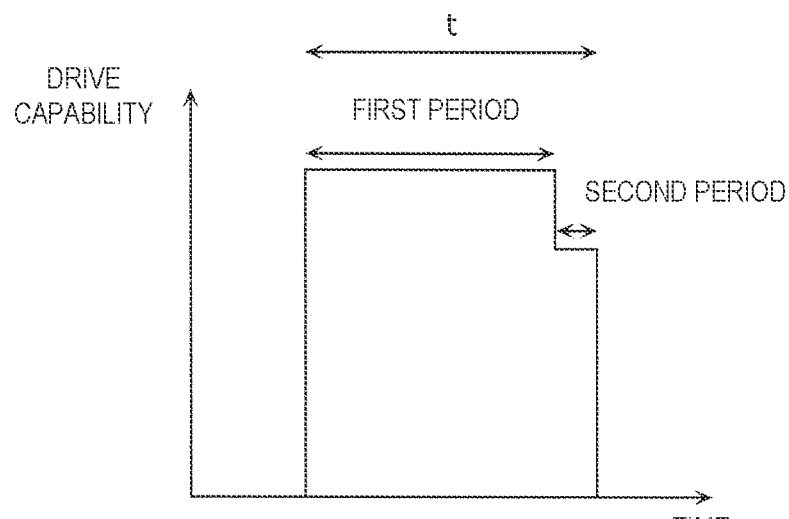
FIG. 12B is a diagram illustrating an example of drive capability at an output end connected to a long wire.

FIG. 12B shows an example of the drive capability at an output end OUT connected to a long wire SL.

There is little bluntness in the original waveforms of the input voltage waveforms at the input ends IN connected to the short wires SL. Thus, the drive capability at the output ends OUT corresponding to these input ends IN can be lower on average, as shown in FIG. 12A. Therefore, as shown in FIG. 12A, the switching components 34 adjust the first period and the second period to make a period in which the drive capability is high shorter and to make a period in which the drive capability is low longer. As a result, the drive capability in the period t can be made lower on average. Here, the first period indicates a period in which the switches SW1 connected to the output ends OUT that are connected to the short wires SL are turned on. The second period indicates a period in which the switches SW2 connected to the output ends OUT are turned on.

On the other hand, the original waveforms of the input voltage waveforms at the input ends IN connected to the long wires SL are blunted. Thus, in order to reduce this bluntness, the drive capability at the output ends OUT corresponding to these input ends IN needs to be higher on average, as shown in FIG. 12B. Therefore, as shown in FIG. 12B, the switching components 34 adjust the first period and the second period to make a period in which the drive capability is high longer and to make a period in which the drive capability is low shorter. As a result, the drive capability in the period t can be made higher on average. Here, the first period indicates a period in which the switches SW1 connected to the output ends OUT that are connected to the long wires SL are turned on. The second period indicates a period in which the switches SW2 connected to the output ends OUT are turned on.

As discussed above, with the liquid crystal display device 1 in accordance with the second embodiment, the drive capability at the output ends OUT can be varied (the current waveform can be varied) by adjusting the time in which the first circuits 33a and the second circuits 33b are connected to the output ends OUT according to the wire length. Therefore, even when the first circuits 33a and the second circuits 33b are built into the signal generator 20a, the time in which the first circuits 33a and the second circuits 33b are connected to the output ends OUT can be adjusted with software, for example, so the signal generator 20a can be used with a plurality of types of display panel 10 of different size.

Also, with the liquid crystal display device in accordance with the second embodiment, the switching components 34 are controlled so that the longer is the wire SL that is connected to an output end OUT, the higher is the drive capability at the output end OUT. In other words, with the liquid crystal display device 1 in accordance with the second embodiment, the switching components 34 are controlled so that the shorter is the wires SL that is connected to an output end OUT, the lower is the drive capability at the output end OUT. Therefore, the input voltage waveform that is changed according to the drive capability (i.e., the current waveform according to the drive capability) can be changed closer to the desired waveform. For example, the period in which the first circuits 33*a* are connected and the period in which the second circuits 33*b* are connected to the corresponding output ends OUT are controlled so that the input voltage waveforms at the input ends IN will be substantially the same. That is, the period in which the first circuits 33*a* are connected and the period in which the second circuits 33*b* are connected to the corresponding output ends OUT are controlled so that the values based on the voltages at the input ends IN will fall within a specific range. Consequently, the drive capability at the corresponding output ends OUT can be varied (the current waveform can be varied) so that there will be less variance in the input voltage waveforms at the input ends IN due to the differences in the lengths of the wires SL. Therefore, the differences in the lengths of the wires SL connecting the signal generator 20*a* and the display panel 10 will be less likely to produce variance in the brightness and chromaticity.

In the illustrated embodiment, alternatively or optionally, the switching components 34 can selectively switch the connection of the first circuits 33*a* and the second circuits 33*b* to the output ends OUT while the first period in which the first circuits 33*a* are connected to the output ends OUT in the period t is the same as the second period in which the second circuits 33*b* are connected to the output ends OUT. In this case, the first circuits 33*a* are circuits that raise the drive capability in proportion to the lengths of the wires, and are buffers, for example. In the illustrated embodiment, these buffers can be ones the drive capability of which can be adjusted by the switching components 34, etc. The drive capability at the output ends OUT in this case will be described through reference to FIGS. 13A and 13B.

Figure 13A:
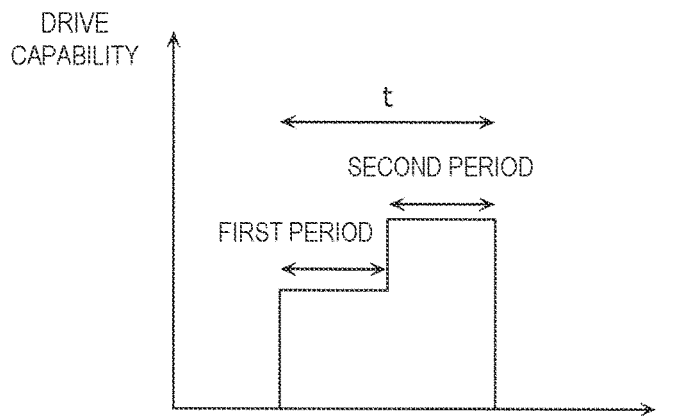
FIG. 13A is a diagram illustrating another example of drive capability at an output end connected to a short wire.

FIG. 13A shows another example of the drive capability at an output end OUT connected to a short wire SL.

Figure 13B:
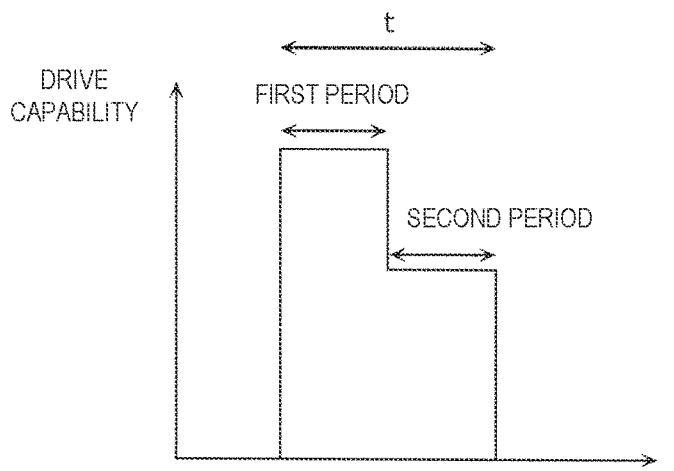
FIG. 13B is a diagram illustrating another example of drive capability at an output end connected to a long wire.

FIG. 13B shows another example of the drive capability at an output end OUT connected to a long wire SL.

There is little bluntness in the original waveforms of the input voltage waveforms at the input ends IN connected to the short wires SL. Thus, the drive capability at the output ends OUT corresponding to these input ends IN can be lower on average, as shown in FIG. 13A. Therefore, as shown in FIG. 13A, the switching components 34 adjust the drive capability of the first circuits 33*a* connected to the output ends OUT that are connected to the short wires SL to lower the drive capability of the first circuits 33*a* in the first period. Here, the first period indicates a period in which the switches SW1 are turned on. As a result, the drive capability in the period t is lower on average.

On the other hand, the original waveforms of the input voltage waveforms at the input ends IN connected to the long wires SL are blunted. Thus, in order to reduce this bluntness, the drive capability at the output ends OUT corresponding to these input ends IN needs to be higher on average, as shown in FIG. 13B. Therefore, as shown in FIG. 13B, the switching components 34 adjust the drive capability of the first circuits 33*a* connected to the output ends OUT that are connected to the long wires SL to raise the drive capability of the first circuits 33*a* in the first period. As a result, the drive capability in the period t is higher on average.

Thus, the drive capability at the output ends OUT in the first period can be adjusted according to the wire length. This allows the drive capability of the first circuits 33*a* to be adjusted with software, for example, even when the first circuits 33*a* and the second circuits 33*b* are built into the signal generator 20*a*. Thus, the signal generator 20*a* can be used with a plurality of types of display panel 10 of different size. Alternatively or optionally, the switching components 34 can also be configured to adjust the drive capability of the second circuits 33*b* (such as buffers) according to the wire length in a manner similar to the above-mentioned adjustment of the drive capability of the first circuits 33*a*.

Third Embodiment

Referring now to FIGS. 14 to 18B, a liquid crystal display device 1 in accordance with a third embodiment will now be explained. In view of the similarity between the first to third embodiments, the parts of the third embodiment that are identical to the parts of the first and second embodiments will be given the same reference numerals as the parts of the first and second embodiments. Moreover, the descriptions of the parts of the third embodiment that are identical to the parts of the first and second embodiments may be omitted for the sake of brevity.

The liquid crystal display device 1 in accordance with the third embodiment is basically identical to the liquid crystal display device 1 in accordance with the first embodiment, except that the liquid crystal display device 1 in accordance with the third embodiment it includes a signal generator 20*b* instead of the signal generator 20, and a controller 40 on the outside of the signal generator 20*b*, for example. The rest of the configuration is the same as in the first embodiment, and will therefore not be described again.

Figure 14:
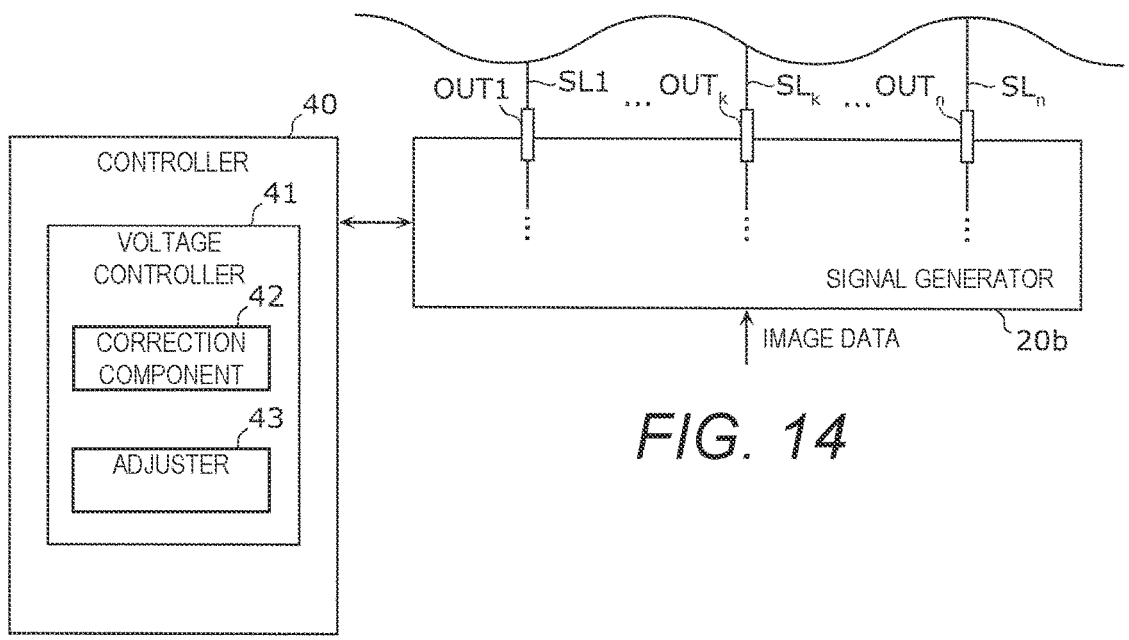
FIG. 14 is a schematic diagram illustrating the configuration around a signal generator of a liquid crystal display device in accordance with a third embodiment.

FIG. 14 is a schematic diagram illustrating the configuration around the signal generator 20*b* of the liquid crystal display device 1 in accordance with the third embodiment.

The signal generator 20*b* generates data signals having voltages corresponding to gradation values of the image data from the image data output component 100, for each of the pixels $P_{ij}$ to $P_{mj}$ included in the selected pixel columns $C_j$. The signal generator 20*b* applies the data signals thus produced to the input ends IN of the corresponding pixel columns $C_j$ via the output ends OUT and the wires SL1 to SL$_n$. That is, in the first embodiment, the signal generator 20 applies the produced data signals to the input ends IN via the controller 30. On the other hand, in the third embodiment, the signal generator 20*b* applies the produced data signals to the input ends IN without going through the controller 30.

The controller 40 has a voltage controller 41 that varies the voltage waveforms (output voltage waveform) corresponding to the data signals at the output ends OUT. The controller 40 (voltage controller 41) varies the voltage waveforms corresponding to the data signals at the output ends OUT to keep the values based on the voltages (input voltage waveforms) at the input ends IN within a specific range. In particular, the controller 40 (voltage controller 41) varies the voltage waveforms corresponding to the data signals at the output ends OUT to keep the values based on the voltages at the input ends IN within the specific range that is explained in the first embodiment by referring to FIG. 8. The voltage waveforms corresponding to the data signals at the output ends OUT will hereinafter also be referred to simply as voltage waveforms (output voltage waveforms).

In the illustrated embodiment, the controller 40 (the voltage controller 41) is an electric controller including a microcomputer or a processor. The controller 40 (the voltage controller 41) can also include other conventional components such as an input interface circuit, an output interface circuit, and storage devices such as a ROM (Read Only Memory) and a RAM (Random Access Memory).

As shown in FIG. 14, the voltage controller 41 includes a correction component 42 and an adjuster 43. The voltage controller 41 makes the signal generator 20b output voltage waveforms from the output ends OUT, according to the lengths of the wires SL connected to the output ends OUT. More specifically, the output voltage waveforms each include a first voltage level and a second voltage level that is lower than the first voltage level. The controller 40 varies at least one of the first voltage level and the duration of the first voltage level according to the lengths of the wires SL. The second voltage level refers to the voltage in a steady state after the waveform rises in the rectangular output voltage waveforms at the output ends OUT. The first voltage level refers to the voltage when the rising edge of the output voltage waveforms projects in the rising direction more than the second voltage level. That is, the voltage waveforms are a waveform in which overshoot has occurred. The difference between the first voltage level and the second voltage level here is called the projection amount.

The first voltage level at the output ends OUT connected to the wires SL of a specific length out of the wires SL is higher than the first voltage level at the output ends OUT connected to the wires SL that are shorter than the specific length while supplying the data signals corresponding to a specific gradation (e.g., the same gradation) to the pixels. Thus, in the illustrated embodiment, the controller 40 is configured to vary the first voltage level such that the first voltage level at one of the output ends OUT connected to one of the wires SL that has the specific length (e.g., the long wire SL) is higher than the first voltage level at another one of the output ends OUT connected to another one of the wires that is shorter than the specific length (e.g., the short wire SL) while supplying the data signal corresponding to the specific gradation to the pixels. The "wires SL of a specific length" are the longer wire SL when the lengths of any two of the wires SL are compared. Thus, the voltage controller 41 controls the signal generator 20b such that the signal generator 20b outputs the output voltage waveforms in which overshoot has occurred according to the wire lengths, as the output voltage waveforms according to the wire lengths, from the output ends OUT of the signal generator 20b. More specifically, the longer is the wire SL, the more the correction component 42 raises the first voltage level (increases the projection amount of overshoot). On the other hand, the shorter is the wire SL, the more the correction component 42 lowers the first voltage level (reduces the projection amount of overshoot).

Also, the duration of the first voltage level at the output ends OUT connected to the wires SL of a specific length out of the wires SL is longer than the duration of the first voltage level at the output ends OUT connected to the wires SL that are shorter than the specific length while supplying the data signals corresponding to a specific gradation (e.g., the same gradation) to the pixels. Thus, in the illustrated embodiment, the controller 40 is configured to vary the duration of the first voltage level such that the duration of the first voltage level at one of the output ends OUT connected to one of the wires SL that has the specific length (e.g., the long wire SL) is longer than the duration of the first voltage level at another one of the output ends OUT connected to another one of the wires SL that is shorter than the specific length (e.g., the short wire SL) while supplying the data signal corresponding to the specific gradation to the pixels. More specifically, the longer is the wire SL, the more the adjuster 43 increases the duration of the first voltage level (the duration of overshoot). On the other hand, the shorter is the wire SL, the more the adjuster 43 reduces the duration of the first voltage level (the duration of overshoot).

Furthermore, the output voltage waveforms each include a third voltage level that is lower than the second voltage level. The controller 40 (the voltage controller 41) varies at least one of the third voltage level and the duration of the third voltage level according to the lengths of the wires SL. The third voltage level is the voltage while the falling edge of the rectangular output voltage waveforms at the output ends OUT projects in the falling direction more than the voltage when the waveform falls to a steady state. That is, the voltage waveforms are a waveform in which undershoot has occurred. The difference between the third voltage level and the voltage when the waveform has fallen to a steady state will also be called the projection amount.

The third voltage level at the output ends OUT connected to the wires SL of a specific length out of the wires SL is lower than the third voltage level at the output ends OUT connected to the wires SL that are shorter than the specific length while supplying the data signals corresponding to a specific gradation (e.g., the same gradation) to the pixels. Specifically, the controller 40 is configured to vary the third voltage level such that the third voltage level at one of the output ends OUT connected to one of the wires SL that has the specific length (e.g., the long wire SL) is lower than the third voltage level at another one of the output ends OUT connected to another one of the wires SL that is shorter than the specific length (e.g., the short wire SL) while supplying the data signal corresponding to the specific gradation to the pixels. Thus, the voltage controller 41 controls the signal generator 20b such that the signal generator 20b outputs the output voltage waveforms in which undershoot has occurred according to the wire lengths, as the output voltage waveforms according to the wire lengths, from the output ends OUT of the signal generator 20b. More specifically, the longer is the wire SL, the more the correction component 42 lowers the third voltage level (increases the projection amount of undershoot). On the other hand, the shorter is the wire SL, the more the correction component 42 raises the third voltage level (reduces the projection amount of undershoot).

Also, the duration of the third voltage level at the output ends OUT connected to the wires SL of a specific length out of the wires SL is longer than the duration of the third voltage level at the output ends OUT connected to the wires SL that are shorter than the specific length while supplying the data signals corresponding to a specific gradation (e.g., the same gradation) to the pixels. Specifically, the controller 40 is configured to vary the duration of the third voltage level such that the duration of the third voltage level at one of the output ends OUT connected to one of the wires SL that has the specific length (e.g., the long wire SL) is longer than the duration of the third voltage level at another one of the output ends OUT connected to another one of the wires SL that is shorter than the specific length (e.g., the short wire SL) while supplying the data signal corresponding to the specific gradation to the pixels. More specifically, the longer is the wire SL, the more the adjuster 43 increases the duration of the third voltage level (the duration of undershoot). On the other hand, the shorter is the wire SL, the more the adjuster 43 reduces the duration of the third voltage level (the duration of undershoot).

Figure 18A:
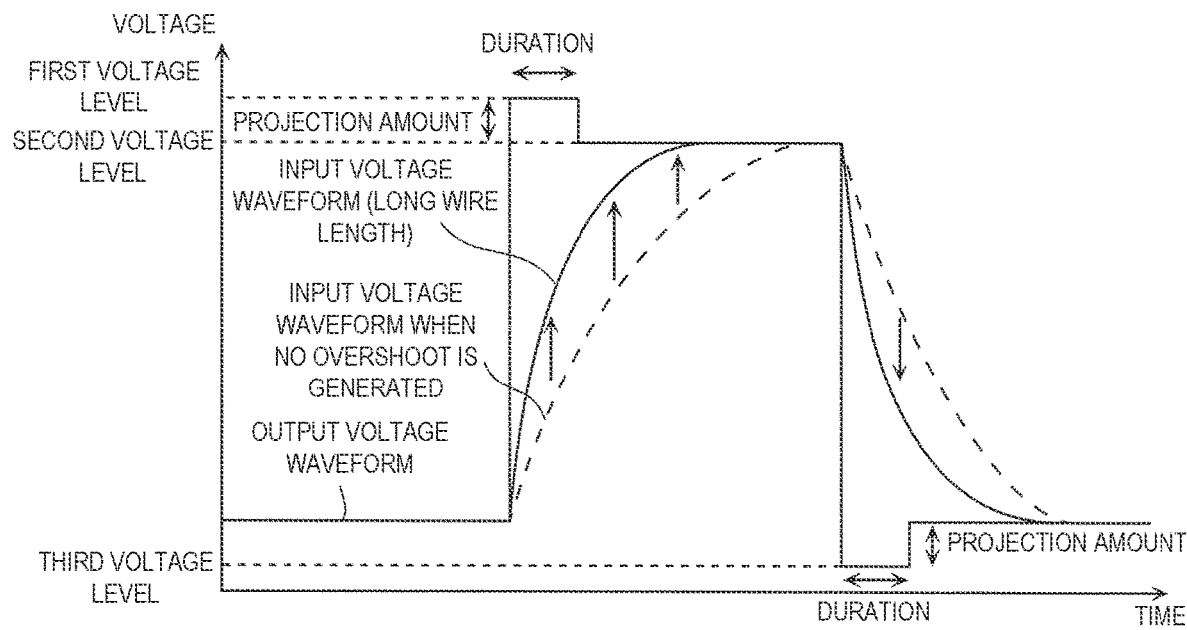
FIG. 18A is a diagram illustrating an example of the change in the output voltage waveform at an output end connected to a long wire and the input voltage waveform at an input end connected to the long wire.
Figure 18B:
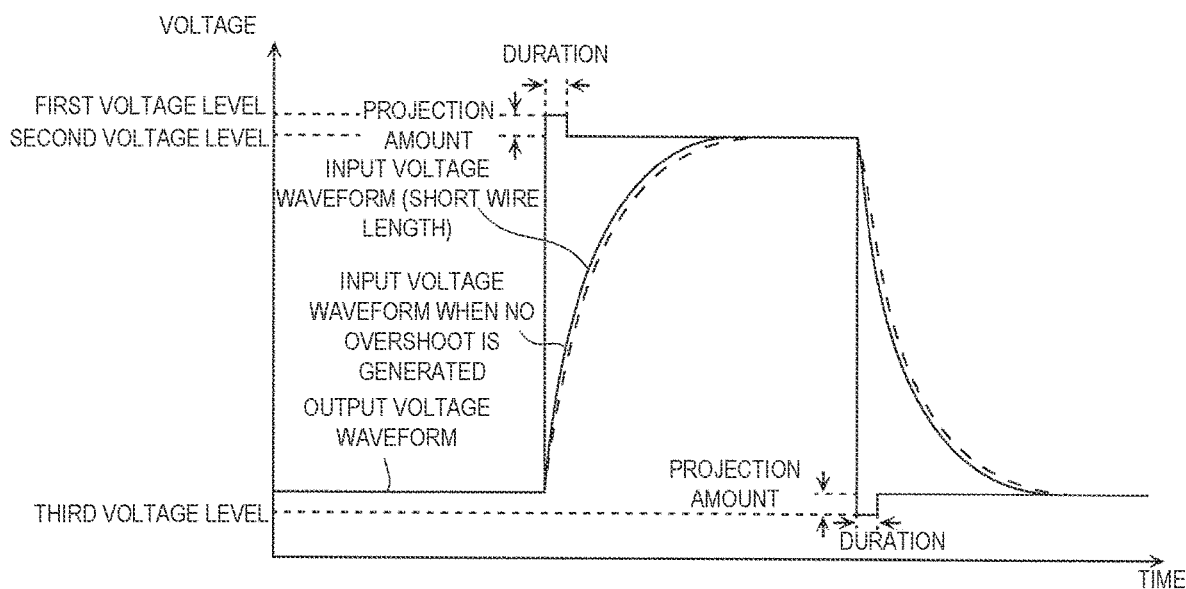
FIG. 18B is a diagram illustrating an example of the change in the output voltage waveform at an output end connected to a short wire and the input voltage waveform at an input end connected to the short wire.

Output voltage waveforms in which overshoot and undershoot have occurred are shown in FIGS. 18A and 18B (discussed below).

Figure 15A:
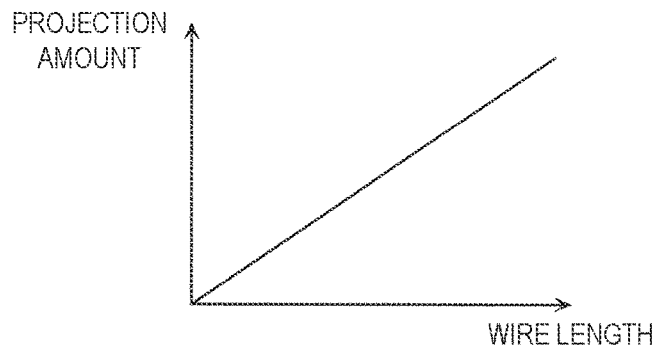
FIG. 15A is a diagram illustrating an example of a predetermined correlation between wire length and projection amount of overshoot.
Figure 15B:
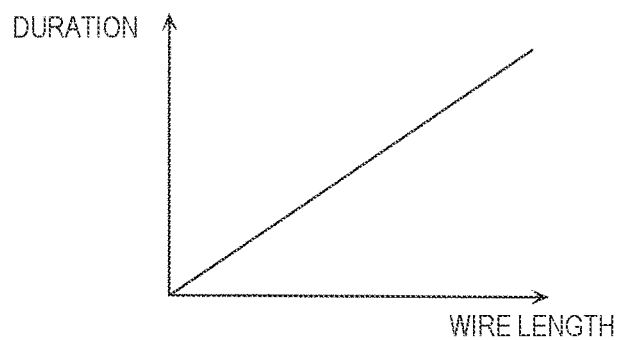
FIG. 15B is a diagram illustrating an example of a predetermined correlation between wire length and the duration of overshoot.

The voltage controller 41 (the correction component 42 and the adjuster 43) generates the overshoot for a given wire length according to a predetermined correlation between the wire length and the projection amount of overshoot, and a predetermined correlation between the wire length and the duration of overshoot. Also, the voltage controller 41 (the correction component 42 and the adjuster 43) generates the undershoot for a given wire length according to a predetermined correlation between the wire length and the projection amount of overshoot, and a predetermined correlation between the wire length and the duration of undershoot. Information about these correlations are stored in a memory component (not shown) provided to the liquid crystal display device 1 in accordance with the third embodiment, for example. The voltage controller 41 (the correction component 42 and the adjuster 43) generates the overshoot and the undershoot by referring to these correlations. Referring now to FIGS. 15A and 15B, the predetermined correlation between the wire length and the projection amount of overshoot, and the predetermined correlation between the wire length and the projection amount of undershoot will now be described.

FIG. 15A is a diagram illustrating an example of the predetermined correlation between the wire length and the projection amount of overshoot.

FIG. 15B is a diagram illustrating an example of the predetermined correlation between the wire length and the duration of overshoot.

As shown in FIG. 15A, the correction component 42 generates overshoot having a larger projection amount (higher first voltage level) in the output voltage waveforms outputted from the output ends OUT as the wires SL that are connected to the output ends OUT becomes longer. The correction component 42 also generates overshoot having a smaller projection amount (lower first voltage level) in the output voltage waveforms outputted from the output ends OUT as the wires SL that are connected to the output ends OUT becomes shorter. For example, the correction component 42 acquires information related to the pixel column $C_j$ to which the signal generator 20b supplies the data signal (such as the length of the wire SL connected to the input end IN in the pixel column $C_j$). The correction component 42 refers to the predetermined correlation between the wire length and the projection amount of overshoot using the information to obtain the projection amount of overshoot. The correction component 42 then corrects the image data sampled by a sampling memory, for example, of the signal generator 20b according to the obtained projection amount of overshoot. That is, the correction component 42 varies the output voltage waveforms outputted from the output ends OUT by correcting the image data inputted from the image data output component 100 according to the predetermined correlation.

As shown in FIG. 15B, the longer is the wire SL that is connected to an output end OUT, the more the adjuster 43 increases the duration of overshoot (the duration of the first voltage level) generated in the output voltage waveform outputted from the output end OUT. Also, the shorter is the wire SL that is connected to an output end OUT, the more the adjuster 43 decreases the duration of overshoot (the duration of the first voltage level) generated in the output voltage waveform outputted from the output end OUT. For example, the adjuster 43 acquires information related to the pixel column $C_j$ to which the signal generator 20b supplies the data signal (such as the length of the wire SL connected to the input end IN in the pixel column $C_j$). The correction component 42 refers to the predetermined correlation between the wire length and the duration of overshoot using the information to obtain the duration of overshoot. The adjuster 43 then adjusts the duration of overshoot generated in the output voltage waveform (data signal) outputted to the output end OUT from a voltage follower that is made up of an output buffer and an op-amp, for example, of the signal generator 20b. This adjustment is done using a master clock (reference clock) produced by a clock generator provided to the liquid crystal display device 1, for example.

The predetermined correlation between the wire length and the projection amount of undershoot, and the predetermined correlation between the wire length and the duration of undershoot have the same correlation as with the case of the overshoot shown in FIGS. 15A and 15B. Thus, the detail will not be described again.

The first voltage levels at the output ends OUT connected to the wires SL can be substantially the same values (e.g., substantially equal to each other) while supplying data signals corresponding to a specific gradation (e.g., the same gradation) to the pixels. That is, the correction component 42 need not increase the projection amount of overshoot as the wire SL becomes longer, and need not decrease the projection amount of overshoot as the wire SL becomes shorter. The predetermined correlation between the wire length and the projection amount of overshoot, and the predetermined correlation between the wire length and the duration of overshoot in this case will be described through reference to FIGS. 16A and 16B.

Figure 16A:
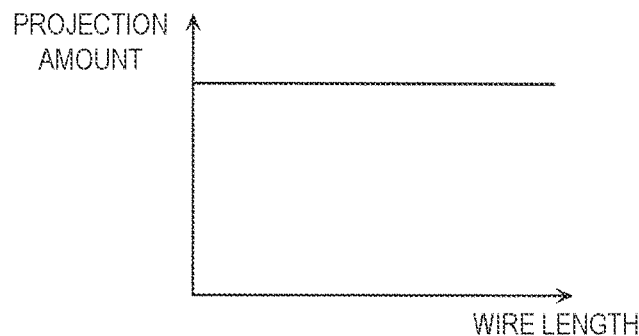
FIG. 16A is a diagram illustrating another example of a predetermined correlation between wire length and projection amount of overshoot.

FIG. 16A is a diagram illustrating another example of the predetermined correlation between the wire length and the projection amount of overshoot.

Figure 16B:
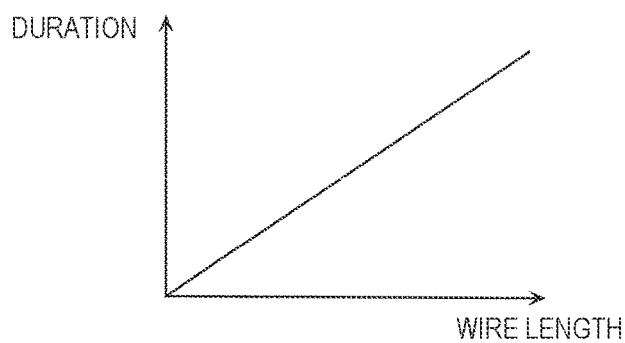
FIG. 16B is a diagram illustrating another example of a predetermined correlation between wire length and the duration of overshoot.

FIG. 16B is a diagram illustrating another example of the predetermined correlation between the wire length and the duration of overshoot.

As shown in FIG. 16A, the correction component 42 generates overshoot having a substantially constant projection amount in the output voltage waveforms at the output ends OUT regardless of the wire length. On the other hand, as shown in FIG. 16B, the longer is the wire SL, the more the adjuster 43 increases the duration of overshoot. Also, the shorter is the wire SL, the more the adjuster 43 decreases the duration of overshoot.

Similarly, the third voltage level at the output ends OUT connected to the wires SL can be substantially the same values (e.g., substantially equal to each other) while supplying data signals corresponding to a specific gradation (e.g., the same gradation) to the pixels. That is, the correction component 42 need not increase the projection amount of undershoot as the wire SL becomes longer, and need not decrease the projection amount of undershoot as the wire SL becomes shorter. The predetermined correlation between the wire length and the projection amount of undershoot projection, and the predetermined correlation between the wire length and the duration of undershoot in this case have the same correlation as with the case for the overshoot shown in FIGS. 16A and 16B, and therefore will not be described again.

Also, the durations of the first voltage level at the output ends OUT connected to the wires SL can be substantially the same values (e.g., substantially equal to each other) while supplying data signals corresponding to a specific gradation (e.g., the same gradation) to the pixels. That is, the adjuster 43 need not increase the duration of overshoot as the wire SL becomes longer, and need not decrease the duration of overshoot as the wire SL becomes shorter. The predetermined correlation between the wire length and the projection amount of overshoot, and the predetermined correlation between the wire length and the duration of overshoot in this case will be described through reference to FIGS. 17A and 17B.

Figure 17A:
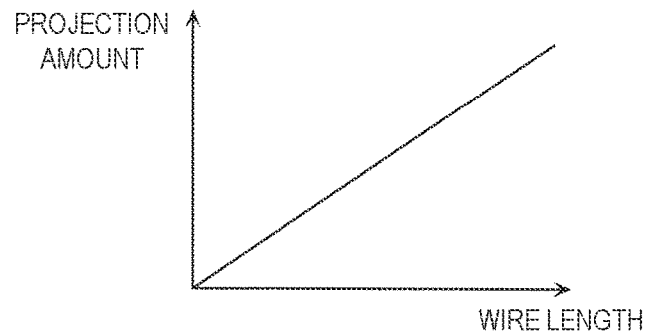
FIG. 17A is a diagram illustrating yet another example of a predetermined correlation between wire length and projection amount of overshoot.

FIG. 17A is a diagram illustrating yet another example of the predetermined correlation between the wire length and the projection amount of overshoot.

Figure 17B:
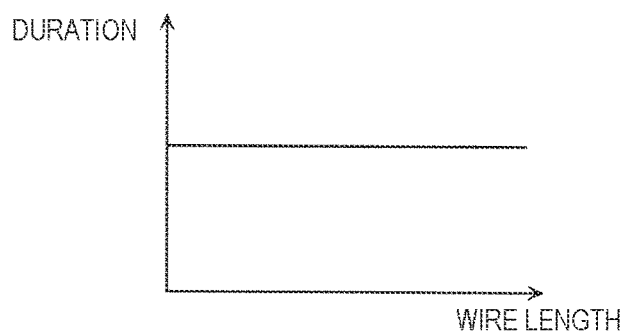
FIG. 17B is a diagram illustrating yet another example of a predetermined correlation between wire length and the duration of overshoot.

FIG. 17B is a diagram illustrating yet another example of the predetermined correlation between the wire length and the duration of overshoot.

As shown in FIG. 17B, the adjuster 43 keeps the duration of overshoot generated in the output voltage waveforms at the output ends OUT substantially constant regardless of the wire length. On the other hand, as shown in FIG. 17A, the correction component 42 increases the projection amount of overshoot as the wire SL becomes longer, and decreases the projection amount of overshoot as the wire SL becomes shorter.

Similarly, the durations of the third voltage level at the output ends OUT connected to the wires SL can be substantially the same values (e.g., substantially equal to each other) while supplying data signals corresponding to a specific gradation (e.g., the same gradation) to the pixels. That is, the adjuster 43 need not increase the duration of undershoot as the wire SL becomes longer, and need not decrease the duration of undershoot as the wire SL becomes shorter. The predetermined correlation between the wire length and the projection amount of undershoot, and the predetermined correlation between the wire length and the duration of undershoot in this case have the same correlation as with the case for the overshoot shown in FIGS. 17A and 17B, and therefore will not be described again.

Thus, the voltage controller 41 should increase the projection amounts of overshoot and undershoot and/or increase the duration of overshoot and undershoot as the wire SL becomes longer. Also, the voltage controller 41 should decrease the projection amounts of overshoot and undershoot and/or decrease the duration of overshoot and undershoot as the wire SL becomes shorter.

Referring now to FIGS. 18A and 18B, the output voltage waveforms in which overshoot and undershoot are generated, and the input voltage waveforms at the input ends IN when these output voltage waveforms have been outputted will now be described.

FIG. 18A is a diagram illustrating an example of the change in the output voltage waveform at an output end OUT connected to a long wire and the input voltage waveform at an input end IN connected to the long wire.

FIG. 18B is a diagram illustrating an example of the change in the output voltage waveform at an output end OUT connected to a short wire and the input voltage waveform at an input end IN connected to the short wire.

As shown in FIG. 18A, in the output voltage waveform at the output end OUT connected to the long wire SL, the first voltage level is higher than the first voltage level in the output voltage waveform at the output end OUT connected to the short wire SL (see FIG. 18B). Also, in the output voltage wave form shown in FIG. 18A, the duration of the overshoot (the duration of the first voltage level) is longer than the duration of the overshoot in the output voltage waveform at the output end OUT connected to the short wire SL (see FIG. 18B). Alternatively, in the output voltage waveform at the output end OUT connected to the long wire SL, either the overshoot in which the first voltage level is higher than in the output voltage waveform at the output end OUT connected to the short wire SL, or the overshoot with the longer duration of the first voltage level than in the output voltage waveform at the output end OUT connected to the short wire SL can be generated. Consequently, due to the overshoot, the input voltage waveform at the input end IN changes to a waveform with a rapid rise (one with little bluntness) with respect to the input voltage waveform when no overshoot is generated (the waveform indicated by a broken line in FIG. 18A).

Also, as shown in FIG. 18A, in the output voltage waveform at the output end OUT connected to the long wire SL, the third voltage level is lower than the third voltage level in the output voltage waveform at the output end OUT connected to the short wire SL (see FIG. 18B). Also, in the output voltage waveform at the output end OUT connected to the long wire SL, the duration of the undershoot (the duration of the third voltage level) is longer than the duration of the undershoot in the output voltage waveform at the output end OUT connected to the short wire SL (see FIG. 18B). Alternatively, in the output voltage waveform at the output end OUT connected to the long wire SL, either the undershoot in which the third voltage level is lower than in the output voltage waveform at the output end OUT connected to the long wire SL, or the undershoot with the longer duration of the third voltage level than in the output voltage waveform at the output end OUT connected to the short wire SL can be generated. Consequently, duet to the undershoot, the input voltage waveform at the input end IN changes to a waveform with a rapid fall with respect to the input voltage waveform when no undershoot is generated (the waveform indicated by a broken line).

As shown in FIG. 18B, in the output voltage waveform at the output end OUT connected to the short wire SL, the first voltage level is lower than the first voltage level in the output voltage waveform at the output end OUT connected to the long wire SL (see FIG. 18A). Also, in the output voltage waveform at the output end OUT connected to the short wire SL, the duration of the overshoot (the duration of the first voltage level) is shorter than the duration of the over shoot in the output voltage waveform at the output end OUT connected to the long wire SL (see FIG. 18A). Alternatively, in the output voltage waveform at the output end OUT connected to the short wire SL, either the overshoot in which the first voltage level is lower than in the output voltage waveform at the output end OUT connected to the long wire SL, or the overshoot with the shorter duration of the first voltage level than in the output voltage waveform at the output end OUT connected to the long wire SL can be generated. The input voltage waveform at the input end IN connected to the short wire SL originally has little waveform bluntness and has a rapid rise. Thus, the output voltage waveform at the output end OUT connected to the short wire SL can change very little with respect to the input voltage waveform when no overshoot is generated (the waveform indicated by the broken line), as shown in FIG. 18B.

Also, as shown in FIG. 18B, in the output voltage waveform at the output end OUT connected to the short wire SL, the third voltage level is higher than the third voltage level in the output voltage waveform at the output end OUT connected to the long wire SL (see FIG. 18A). Also, in the output voltage waveform at the output end OUT connected to the short wire SL, the duration of the undershoot (the duration of the third voltage level) is shorter than the duration of the undershoot in the output voltage waveform at the output end OUT connected to the long wire SL (see FIG. 18A). Alternatively, in the output voltage waveform at the output end OUT connected to the short wire SL, either the undershoot in which the third voltage level is higher than in the output voltage waveform at the output end OUT connected to the long wire SL, or the undershoot with the shorter duration of the third voltage level than in the output voltage waveform at the output end OUT connected to the long wire SL can be generated. The input voltage waveform at the input end IN connected to the short wire SL originally has little waveform bluntness and has a rapid rise. Thus, the output voltage waveform at the output end OUT connected to the short wire SL can change very little with respect to the input voltage waveform when no undershoot is generated, as shown in FIG. 18B.

Thus, by varying the output voltage waveforms, the voltage controller 41 changes the input voltage waveforms at the input ends IN closer to a specific voltage waveform. More specifically, the voltage controller 41 changes the input voltage waveforms at the input ends IN closer to the input voltage waveform at the input end $IN_k$ connected to the shortest wire $SL_k$ of the wires SL, as a specific voltage waveform. That is, the input voltage waveforms at the input ends IN all become substantially the same input voltage waveform, as with the input end $IN_k$. In other words, the values based on the voltages at the input ends IN become values within a specific range.

As discussed above, the liquid crystal display device 1 in accordance with the third embodiment can vary the output voltage waveforms at the output ends OUT according to the wire lengths. Thus, the liquid crystal display device in accordance with the third embodiment can change the input voltage waveforms, which vary due to the output voltage waveforms, closer to the desired waveform. For example, the longer is the wire SL that is connected to an input end IN, the more the input voltage waveform at the input end IN is changed to be closer to an input voltage waveform at an input end IN connected to a short wire. Specifically, the input voltage waveform is changed to a waveform with little bluntness by generating an output voltage waveform in which overshoot and undershoot of large projection or of long duration are produced. Consequently, the overshoot and the undershoot can be generated in the output voltage waveform so that less variance in the input voltage waveforms at the input ends IN will be caused by differences in the lengths of the wires SL. Thus, there will be less variance in brightness due to differences in the lengths of the wires SL connecting the signal generator 20b and the display panel 10.

Also, if no undershoot is produced, then the shorter is the wire SL, the slower will be the fall of the input voltage waveform at the input end IN. As a result, the input voltage waveform in the next frame can be affected by the input voltage waveform of the previous frame. Therefore, the voltage controller 41 can reduce the effect of the input voltage waveform of the previous frame on the input voltage waveform of the next frame by outputting an output voltage waveform in which undershoot is produced according to the wire length from the output end OUT to the signal generator 20b.

Other Embodiments

The liquid crystal display device 1 in accordance with the embodiments of the present invention are described above, but the present invention is not limited to or by these embodiments.

For example, in the first embodiment above, the current controllers 31 change the input voltage waveforms at the input ends IN to a specific voltage waveform. Specifically, the current controllers 31 change the input voltage waveforms closer to the input voltage waveform at the input end IN1 ($IN_1$) connected to the longest wire SL1 ($SL_n$) of the wires SL or closer to the input end $IN_k$ connected to the shortest wire $SL_k$ of the wires SL. However, this is not the only option. For instance, the current controllers 31 can change the input voltage waveforms at the input ends IN closer to an input voltage waveform at an input end IN connected to a wire SL of middle length that is between the wire length of the longest wire SL1 ($SL_n$) and the wire length of the shortest wire $SL_k$. In this case, the current controllers 31 includes circuits that lower the drive capacity, and circuits that raise the drive capacity. The current controllers 31 are configured such that the shorter is a wire SL that is connected to an output end OUT relative to the wire SL of middle length, the more the circuit that is connected to the output end OUT lowers the drive capability as the current controller 31. Also, the current controllers 31 are configured such that the longer is a wire SL that is connected to an output end OUT relative to the wire SL of middle length, the more the circuit that is connected to the output end OUT raises the drive capability as the current controller 31. Consequently, the input voltage waveforms at the input ends IN are substantially the same input voltage waveforms, as with the input end IN connected to the wire SL of middle length.

Also, in the first and second embodiments above, the controller 30 is built into the signal generator 20 (20a). However, this is not the only option. For instance, the controller 30 can be provided outside of the signal generator 20 (20a). In particular, the controller 30 can be independently provided relative to the signal generator 20 (20a) as an external device.

Also, in the second embodiment above, for example, the switching components 34 control how long the switches SW1 and the switches SW2 of the switching components 34 are turned on. However, this is not the only option. For instance, the switching components 34 can be configured not to control how long the switches SW1 and the switches SW2 of the switching components 34 are turned on. In this case, for example, the image data output component 100, etc., can control how long the switches SW1 and the switches SW2 of the switching components 34 are turned on.

Also, in the third embodiment above, for example, the voltage controller 41 control the signal generator 20b to output the output voltage waveforms from the output ends OUT according to the lengths of the wires SL connected to the output ends OUT. However, this is not the only option. For instance, the voltage controller 41 can output an output voltage waveform according not only to the wire length, but also to the image data of the previous and following consecutive frames. For instance, if the image data of the previous and following consecutive frames is data indicating gradation values that are close to each other, then the input voltage waveform has little change for the previous and following consecutive frames. Thus, the voltage controller 41 can reduce the projection amounts of overshoot and undershoot, or can reduce the duration of overshoot and undershoot.

Also, in the third embodiment above, for example, the voltage controller 41 generates overshoot and undershoot. However, this is not the only option. For instance, the voltage controller 41 can generate at least overshoot.

Furthermore, the above embodiments can be combined with one another.

The present invention is useful in liquid crystal display devices such as tablet terminals, smart phones, and television sets that display video.

[1] In view of the state of the known technology and in accordance with an aspect of a first mode of the present invention, a liquid crystal display device comprises a display panel, a signal generator, a plurality of wires, and a controller. The display panel has a plurality of pixels. The signal generator is configured to supply data signal to the pixels. The wires connect output ends of the signal generator to input ends of the pixels, respectively. The controller is configured to vary at least one of voltage waveform and current waveform corresponding to the data signal at the output ends according to lengths of the wires. For example, the controller is configured to vary at least one of the voltage waveform and the current waveform such that values based on the voltages at the input ends falls within a specific range.

It has been discovered that when the wires have different lengths, the difference in resistance related to the wire length (e.g., the length of the wire) will end up producing variance in the voltage at the input ends (input voltage waveform). That is, there ends up being a difference between the charge voltages of the pixels connected to longer and shorter wires. Thus, variance in brightness and chromaticity ends up being seen by a viewer.

On the other hand, with the liquid crystal display device configured as above, the controller varies at least one of the voltage waveform and the current waveform at the output ends according to the lengths of the wires. For example, the controller varies at least one of the voltage waveform and the current waveform at the output ends such that values based on the voltages at the input ends will be values within a specific range. Here, "values based on the voltages at the input ends" refers to differences in chromaticity coordinates for any two regions of the display panel, for example. Also, "values within a specific range" refers to differences in chromaticity coordinates that cannot be seen or noticed by a viewer. With this configuration, it is less likely that variance in the chromaticity that can be seen or noticed by a viewer will occur. Reducing variance in chromaticity also reduces variance in brightness. Therefore, with this configuration, it is less likely that variance in brightness and chromaticity caused by a difference in the lengths of the wires that connect the signal generator and the display panel will be produced.

[2] In accordance with a preferred embodiment according to the liquid crystal display device mentioned above, the current waveform can include a first current level and a second current level that is lower than the first current level. The controller can be configured to vary the first current level according to the lengths of the wires.

The first current level is the current value at the start of current flow in the current waveforms at the output ends. The second current level is the current value (specifically, about zero) when current flow has stopped in the current waveforms at the output ends. Consequently, the controller can vary the voltage at the input ends by varying the first voltage level according to the lengths of the wires. Therefore, the controller can make sure that values based on voltages at the input ends will be values within a specific range. Also, the controller can make it less likely that variance will occur in brightness and chromaticity as a result of differences in the lengths of the wires connecting the signal generator and the display panel.

[3] In accordance with a preferred embodiment according to any one of the liquid crystal display devices mentioned above, the controller is configured to vary the first current level such that the first current level at one of the output ends connected to one of the wires that has a specific length is higher than the first current level at another one of the output ends connected to another one of the wires that is shorter than the specific length while supplying data signal corresponding to a specific gradation to the pixels. For example, the first current level at the output ends connected to wires of the specific length out of the wires is higher than the first current level at the output ends connected to wires shorter than the specific length when the data signal corresponding to the specific gradation is supplied to the pixels.

When the data signals corresponding to the same specific gradation are supplied to the pixels, the current flow decreases and the bluntness of the input voltage waveform increases at the input end as the length of the wire that is connected to the input end becomes longer (due to the difference in the lengths of the wires). In view of this, when the data signals corresponding to the same specific gradation are supplied to the pixels, the first current level at one of the output ends connected to one of the wires that has the specific length is set to a value that is higher than the first current level at another one of the output ends connected to another one of the wires that is shorter than the specific length. The "one of the wires that has a specific length" here refers to a longer one of the wires that is longer than a shorter one of the wires when any two of the wires are compared. Consequently, the input voltage waveform at an input end connected to a longer one of the wires that has the specific length becomes less blunt, as with the input voltage waveform at an input end connected to a shorter one of the wires that is shorter than the specific length, since the current waveform at the output end connected to the longer one of the wires has a higher first current level. Therefore, the controller can keep the values based on the voltages at the input ends within a specific range. This makes it less likely that a difference in the lengths of the wires connecting the signal generator and the display panel will produce variance in brightness and chromaticity.

[4] In accordance with a preferred embodiment according to any one of the liquid crystal display devices mentioned above, the voltage waveform can include a first voltage level and a second voltage level that is lower than the first voltage level. The controller can be configured to vary at least one of the first voltage level and a duration of the first voltage level according to the lengths of the wires.

The second voltage level is the voltage in a steady state after the waveform rises in the voltage waveform (rectangular wave) at the output ends. The first voltage level is the voltage when the rising edge of the voltage waveform projects in the rising direction more than the second voltage level. That is, the voltage waveform is a waveform in which overshoot has occurred. Consequently, the controller can vary the voltage at the input ends by varying at least one of the first voltage level and the duration of the first voltage level according to the lengths of the wires. Therefore, the controller can keep the values based on the voltages at the input ends within a specific range. This makes it less likely that a difference in the lengths of the wires connecting the signal generator and the display panel will produce variance in brightness and chromaticity.

[5] In accordance with a preferred embodiment according to any one of the liquid crystal display devices mentioned above, the controller is configured to vary the first voltage level such that the first voltage level at one of the output ends connected to one of the wires that has a specific length is higher than the first voltage level at another one of the output ends connected to another one of the wires that is shorter than the specific length while supplying data signal corresponding to a specific gradation to the pixels. For example, the first voltage level at the output ends connected to wires of the specific length out of the wires can be higher than the first voltage level at the output ends connected to wires shorter than the specific length when the data signals corresponding to the specific gradation are supplied to the pixels.

When the data signals corresponding to the same specific gradation are supplied to the pixels, and the voltage waveforms at the output ends are all the same, then the bluntness of the input voltage waveform increases at the input end as length of the wire that is connected to the input end becomes longer (due to the difference in the lengths of the wires). In view of this, when the data signals corresponding to the same specific gradation are supplied to the pixels, the first voltage level at one of the output ends connected to one of the wires that has the specific length is set to be higher than the first voltage level at another one of the output ends connected to another one of the wires that is shorter than the specific length. Consequently, the input voltage waveform at an input end connected to a longer one of the wires that has the specific length becomes less blunt, as with the input voltage waveform at an input end connected to a shorter one of the wires that is shorter than the specific length, since the voltage waveform at the output end connected to the longer one of the wires has a higher first voltage level. Therefore, the controller can keep the values based on the voltages at the input ends within a specific range. This makes it less likely that a difference in the lengths of the wires connecting the signal generator and the display panel will produce variance in brightness and chromaticity.

[6] In accordance with a preferred embodiment according to any one of the liquid crystal display devices mentioned above, the controller is configured to vary the duration of the first voltage level such that the duration of the first voltage level at one of the output ends connected to one of the wires that has a specific length is longer than the duration of the first voltage level at another one of the output ends connected to another one of the wires that is shorter than the specific length while supplying data signal corresponding to a specific gradation to the pixels. For example, the duration of the first voltage level at the output ends connected to wires of the specific length out of the wires can be longer than the duration of the first voltage level at the output ends connected to wires shorter than the specific length when the data signals corresponding to the specific gradation are supplied to the pixels.

Consequently, the input voltage waveform at an input end connected to a longer one of the wires that has the specific length is less blunt, as with the input voltage waveform at an input end connected to a shorter one of the wires that is shorter than the specific length, since the voltage waveform at the output end connected to the longer one of the wires has a longer duration of the first voltage level. Therefore, the controller can keep the values based on the voltages at the input ends within a specific range. This makes it less likely that a difference in the lengths of the wires connecting the signal generator and the display panel will produce variance in brightness and chromaticity.

[7] In accordance with a preferred embodiment according to any one of the liquid crystal display devices mentioned above, the first voltage levels at the output ends connected to the wires can be substantially equal to each other (i.e., the same values) while supplying the data signal corresponding to the specific gradation to the pixels.

The controller can keep the values based on the voltages at the input ends within a specific range merely by varying the duration of the first voltage level according to the lengths of the wires. This makes it less likely that a difference in the lengths of the wires connecting the signal generator and the display panel will produce variance in brightness and chromaticity.

[8] In accordance with a preferred embodiment according to any one of the liquid crystal display devices mentioned above, the durations of the first voltage levels at the output ends connected to the wires can be substantially equal to each other (i.e., the same values) while supplying the data signals corresponding to the specific gradation to the pixels.

The controller can keep the values based on the voltages at the input ends within a specific range merely by varying the first voltage level according to the lengths of the wires. This makes it less likely that a difference in the lengths of the wires connecting the signal generator and the display panel will produce variance in brightness and chromaticity.

[9] In accordance with a preferred embodiment according to any one of the liquid crystal display devices mentioned above, the voltage waveform can include a third voltage level that is lower than the second voltage level. The controller can be configured to vary at least one of the third voltage level and a duration of the third voltage level according to the lengths of the wires.

The third voltage level is the voltage when the falling edge of the voltage waveform (rectangular waveform) projects in the falling direction more than the voltage when the waveform falls to a steady state. That is, the voltage waveform is a waveform in which undershoot has occurred. Consequently, the controller can vary the voltages at the input ends by varying at least one of the third voltage level and the duration of the third voltage level. For example, when no undershoot will be generated, the input voltage waveform at the input end becomes a waveform with a slower fall as the wire connected to the input end becomes longer. As a result, the input voltage waveform in the next frame is affected. However, when undershoot is generated, the effect on the input voltage waveform in the next frame can be suppressed. Therefore, the controller can keep the values based on the voltages at the input ends within a specific range. This makes it less likely that a difference in the lengths of the wires connecting the signal generator and the display panel will produce variance in brightness and chromaticity.

[10] In accordance with a preferred embodiment according to any one of the liquid crystal display devices mentioned above, the controller is configured to vary the third voltage level such that the third voltage level at one of the output ends connected to one of the wires that has a specific length is lower than the third voltage level at another one of the output ends connected to another one of the wires that is shorter than the specific length while supplying data signal corresponding to a specific gradation to the pixels. For example, the third voltage level at the output ends connected to wires of the specific length out of the wires can be lower than the third voltage level at the output ends connected to wires shorter than the specific length when the data signals corresponding to the specific gradation are supplied to the pixels.

Consequently, the input voltage waveform at an input end connected to a longer one of the wires that has the specific length has less effect on the input voltage waveform of the next frame, as with the input voltage waveform at an input end connected to a shorter one of the wires that is shorter than the specific length, since the voltage waveform at the output end connected to the longer one of the wires has a lower third voltage level. Therefore, the controller can keep the values based on the voltages at the input ends within a specific range. This makes it less likely that a difference in the lengths of the wires connecting the signal generator and the display panel will produce variance in brightness and chromaticity.

[11] In accordance with a preferred embodiment according to any one of the liquid crystal display devices mentioned above, the controller is configured to vary the duration of the third voltage level such that the duration of the third voltage level at one of the output ends connected to one of the wires that has a specific length is longer than the duration of the third voltage level at another one of the output ends connected to another one of the wires that is shorter than the specific length while supplying data signal corresponding to a specific gradation to the pixels. For example, the duration of the third voltage level at the output ends connected to wires of the specific length out of the wires can be longer than the duration of the third voltage level at the output ends connected to wires shorter than the specific length when the data signals corresponding to the specific gradation are supplied to the pixels.

Consequently, the input voltage waveform at an input end connected to a longer one of the wires that has the specific length has less effect on the input voltage waveform of the next frame, as with the input voltage waveform at an input end connected to a shorter one of the wires shorter than the specific length, since the voltage waveform at the output end connected to the longer one of the wires has a longer duration of the third voltage level. Therefore, the controller can keep the values based on the voltage at the input ends within a specific range. This makes it less likely that a difference in the lengths of the wires connecting the signal generator and the display panel will produce variance in brightness and chromaticity.

[12] In accordance with a preferred embodiment according to any one of the liquid crystal display devices mentioned above, the third voltage levels at the output ends connected to the wires can be substantially equal to each other (i.e., the same values) while supplying the data signal corresponding to the specific gradation to the pixels.

The controller can keep the values based on the voltages at the input ends within a specific range merely by varying the duration of the third voltage level. This makes it less likely that a difference in the lengths of the wires connecting the signal generator and the display panel will produce variance in brightness and chromaticity.

[13] In accordance with a preferred embodiment according to any one of the liquid crystal display devices mentioned above, the durations of the third voltage levels at the output ends connected to the wires can be substantially equal to each other (i.e., the same values) while supplying the data signal corresponding to the specific gradation to the pixels.

The controller can keep the values based on the voltages at the input ends within a specific range merely by varying the third voltage level. This makes it less likely that a difference in the lengths of the wires connecting the signal generator and the display panel will produce variance in brightness and chromaticity.

[14] In accordance with a preferred embodiment according to any one of the liquid crystal display devices mentioned above, the controller is configured to vary at least one of the voltage waveform and the current waveform such that a difference in chromaticity coordinates in any two regions on the display panel falls within a specific range while supplying a data signal corresponding to a specific gradation to the pixels. For example, the values based on the voltages at the input ends can be the difference in the chromaticity coordinates in any two regions on the display panel while supplying the data signal corresponding to the specific gradation to the pixels.

[15] In accordance with a preferred embodiment according to any one of the liquid crystal display devices mentioned above, the chromaticity coordinates can each have an x coordinate and a y coordinate. The controller can be configured to vary at least one of the voltage waveform and the current waveform such that at least one of a difference in the x coordinates and a difference in the y coordinates in the two regions falls within a range that is more than or equal to 0 and less than or equal to 0.03. For example, the controller can set at least one of the difference in the x coordinates and the difference in the y coordinates in the two regions to be a value that is at least 0 and no more than 0.03 as the value within the specific range.

[16] In accordance with a preferred embodiment according to any one of the liquid crystal display devices mentioned above, the chromaticity coordinates can each have an x coordinate and a y coordinate. The controller can be configured to vary at least one of the voltage waveform and the current waveform such that at least one of a difference in the x coordinates and a difference in the y coordinates in the two regions falls within a range that is more than or equal to 0 and less than or equal to 0.02. For example, the controller can set at least one of the difference in the x coordinates and the difference in the y coordinates in the two regions to be a value that is at least 0 and no more than 0.02 as the value within the specific range.

Consequently, the controller can set at least one of the difference between the x coordinates and the difference between the y coordinates in any two regions in the image displayed on the display panel to be at least 0 and no more than 0.03, and preferably at least 0 and no more than 0.02, as the value within the specific range. With this configuration, it is easy to make it less likely that a difference in the lengths of the wires connecting the signal generator and the display panel will produce variance in brightness and chromaticity.

[17] In accordance with a preferred embodiment according to any one of the liquid crystal display devices mentioned above, the display panel has a rectangular shape. One of the wires that is connected to one of the input ends located closest to a corner of the display panel is the longest among the wires.

[18] In accordance with a preferred embodiment according to any one of the liquid crystal display devices mentioned above, the display panel has a rectangular shape. One of the wires that is connected to one of the input ends located closest to an end of a long side of the display panel is the longest among the wires.

[19] In accordance with a preferred embodiment according to any one of the liquid crystal display devices mentioned above, the display panel has a rectangular shape. One of the wires that is connected to one of the input ends located closest to a center of a side of the display panel is the longest among the wires.

[20] In accordance with a preferred embodiment according to any one of the liquid crystal display devices mentioned above, the display panel has a rectangular shape. One of the wires that is connected to one of the input ends located closest to a center of a long side of the display panel is the longest among the wires.

The present invention can be realized not only as a liquid crystal display device comprising a processor that can execute the above-mentioned processing, but also as a liquid crystal display method, one of whose steps is the processing executed by the processor included in the display device. It can also be realized as a program that causes a computer to function as the processor included in the liquid crystal display device, or as a program that causes a computer to execute the characteristic step included in the liquid crystal display method. It should go without saying that such a program can be provided via a communication network such as the Internet, or a non-transitory recording medium that can be read by a computer, such as a CD-ROM (compact disc-read only memory), DVD-ROM (digital versatile disc-read only memory), and the like.

The present invention makes it less likely that a difference in the lengths of the wires connecting a signal generator and a display panel will produce variance in brightness and chromaticity.

In accordance with a first aspect of a second mode, a liquid crystal display device comprises: a display panel having a plurality of pixels; a signal generator that supplies data signal to the pixels; a plurality of wires connecting output ends of the signal generator to input ends of the pixels, respectively; and a controller that varies voltage waveform corresponding to the data signal at the output ends by varying both a voltage level at a rising edge of the voltage waveform and a voltage level at a falling edge of the voltage waveform.

In accordance with a second aspect, with the liquid crystal display device according to the first aspect, the controller varies both the voltage level at the rising edge of the voltage waveform and the voltage level at the falling edge of the voltage waveform according to lengths of the wires.

In accordance with a third aspect, with the liquid crystal display device according to the first aspect, the controller varies the voltage level at the rising edge of the voltage waveform such that the voltage level at the rising edge of the voltage waveform at one of the output ends connected to one of the wires that has a specific length is higher than the voltage level at the rising edge of the voltage waveform at another one of the output ends connected to another one of the wires that is shorter than the specific length while supplying data signal corresponding to a specific gradation to the pixels.

In accordance with a fourth aspect, with the liquid crystal display device according to the first aspect, the controller controls the voltage level at the rising edge of the voltage waveform such that durations of the voltage levels at the rising edge of the voltage waveform at the output ends connected to the wires are substantially equal to each other while supplying the data signal corresponding to the specific gradation to the pixels.

In accordance with a fifth aspect, with the liquid crystal display device according to the first aspect, the controller further varies a duration of the voltage level at the rising edge of the voltage waveform according to the lengths of the wires.

In accordance with a sixth aspect, with the liquid crystal display device according to the fifth aspect, the controller varies the duration of the voltage level at the rising edge of the voltage waveform such that the duration of the voltage level at the rising edge of the voltage waveform at one of the output ends connected to one of the wires that has a specific length is longer than the duration of the voltage level at the rising edge of the voltage waveform at another one of the output ends connected to another one of the wires that is shorter than the specific length while supplying data signal corresponding to a specific gradation to the pixels.

In accordance with a seventh aspect, with the liquid crystal display device according to the first aspect, the controller varies the voltage level at the falling edge of the voltage waveform such that the voltage level at the falling edge of the voltage waveform at one of the output ends connected to one of the wires that has a specific length is lower than the voltage level at the falling edge of the voltage waveform at another one of the output ends connected to another one of the wires that is shorter than the specific length while supplying data signal corresponding to a specific gradation to the pixels.

In accordance with an eighth aspect, with the liquid crystal display device according to the first aspect, the controller controls the voltage level at the falling edge of the voltage waveform such that durations of the voltage levels at the falling edge of the voltage waveform at the output ends connected to the wires are substantially equal to each other while supplying the data signal corresponding to the specific gradation to the pixels.

In accordance with a ninth aspect, with the liquid crystal display device according to the first aspect, the controller varies a duration of the voltage level at the falling edge of the voltage waveform such that the duration of the voltage level at the falling edge of the voltage waveform at one of the output ends connected to one of the wires that has a specific length is longer than the duration of the voltage level at the falling edge of the voltage waveform at another one of the output ends connected to another one of the wires that is shorter than the specific length while supplying data signal corresponding to a specific gradation to the pixels.

In accordance with a tenth aspect, with the liquid crystal display device according to the first aspect, the controller varies the voltage waveform such that a difference in chromaticity coordinates in any two regions on the display panel falls within a specific range while supplying data signal corresponding to a specific gradation to the pixels.

In accordance with an eleventh aspect, with the liquid crystal display device according to the tenth aspect, the chromaticity coordinates each have an x coordinate and a y coordinate, and the controller varies the voltage waveform such that at least one of a difference in the x coordinates and a difference in the y coordinates in the two regions falls within a range that is more than or equal to 0 and less than or equal to 0.03.

In accordance with a twelfth aspect, with the liquid crystal display device according to the tenth aspect, the chromaticity coordinates each have an x coordinate and a y coordinate, and at least one of a difference in the x coordinates and a difference in the y coordinates in the two regions falls within a range that is more than or equal to 0 and less than or equal to 0.02.

In accordance with a thirteenth aspect, with the liquid crystal display device according to the first aspect, the voltage waveform includes the voltage level at the rising edge of the voltage waveform that is higher than the voltage level at the falling edge of the voltage waveform.

In accordance with a fourteenth aspect, with the liquid crystal display device according to the first aspect, the voltage waveform includes a voltage level between the rising edge of the voltage waveform and the falling edge of the voltage waveform.

In accordance with a fifteenth aspect, with the liquid crystal display device according to the fourteenth aspect, the voltage level between the rising edge of the voltage waveform and the falling edge of the voltage waveform is a voltage level in a steady state after the voltage waveform rises.

In accordance with a sixteenth aspect, with the liquid crystal display device according to the fourteenth aspect, the voltage level between the rising edge of the voltage waveform and the falling edge of the voltage waveform is different from the voltage level at the rising edge of the voltage waveform and the voltage level at the falling edge of the voltage level.

In accordance with a seventeenth aspect, with the liquid crystal display device according to the fourteenth aspect, the voltage level between the rising edge of the voltage waveform and the falling edge of the voltage waveform is higher than the voltage level at the falling edge of the voltage waveform.

In accordance with an eighteenth aspect, with the liquid crystal display device according to the first aspect, the display panel has a rectangular shape, and one of the wires that is connected to one of the input ends located closest to a corner of the display panel is the longest among the wires.

In accordance with a nineteenth aspect, with the liquid crystal display device according to the first aspect, the display panel has a rectangular shape, and one of the wires that is connected to one of the input ends located closest to an end of a long side of the display panel is the longest among the wires.

In accordance with a twentieth aspect, with the liquid crystal display device according to the first aspect, the display panel has a rectangular shape, and one of the wires that is connected to one of the input ends located closest to a center of a side of the display panel is the longest among the wires.

In accordance with a twenty-first aspect, with the liquid crystal display device according to the first aspect, the display panel has a rectangular shape, and one of the wires that is connected to one of the input ends located closest to a center of a long side of the display panel is the longest among the wires.

In accordance with a first aspect of a third mode, a liquid crystal display device comprises: a display panel including a plurality of pixel columns, the pixel columns each extending along source lines of the display panel and each having an input end and a plurality of pixels connected to the input end, with the pixels receiving data signal from the input end; a signal generator having a plurality of output ends arranged in a first direction of the signal generator with respect to each other, the output ends supplying the data signal to the input ends of the pixel columns, respectively; a plurality of wires connecting the output ends of the signal generator to the input ends of the pixel columns, respectively, the wires having lengths measured between the output ends of the signal generator and the input ends of the pixel columns, respectively, the lengths of the wires becoming longer as the output ends become located farther away from a middle portion of the signal generator in the first direction of the signal generator; and a controller that varies voltage waveform of the data signal at the output ends of the signal generator according to location of the output ends of the signal generator.

In accordance with a second aspect, with the liquid crystal display device according to the first aspect, the controller varies both the voltage level at the rising edge of the voltage waveform and the voltage level at the falling edge of the voltage waveform according to lengths of the wires.

In accordance with a third aspect, with the liquid crystal display device according to the first aspect, the controller varies the voltage level at the rising edge of the voltage waveform such that the voltage level at the rising edge of the voltage waveform at one of the output ends connected to one of the wires that has a specific length is higher than the voltage level at the rising edge of the voltage waveform at another one of the output ends connected to another one of the wires that is shorter than the specific length while supplying data signal corresponding to a specific gradation to the pixels.

In accordance with a fourth aspect, with the liquid crystal display device according to the first aspect, the controller controls the voltage level at the rising edge of the voltage waveform such that durations of the voltage levels at the rising edge of the voltage waveform at the output ends connected to the wires are substantially equal to each other while supplying the data signal corresponding to the specific gradation to the pixels.

In accordance with a fifth aspect, with the liquid crystal display device according to the first aspect, the controller further varies a duration of the voltage level at the rising edge of the voltage waveform according to the lengths of the wires.

In accordance with a sixth aspect, with the liquid crystal display device according to the fifth aspect, the controller varies the duration of the voltage level at the rising edge of the voltage waveform such that the duration of the voltage level at the rising edge of the voltage waveform at one of the output ends connected to one of the wires that has a specific length is longer than the duration of the voltage level at the rising edge of the voltage waveform at another one of the output ends connected to another one of the wires that is shorter than the specific length while supplying data signal corresponding to a specific gradation to the pixels.

In accordance with a seventh aspect, with the liquid crystal display device according to the first aspect, the controller varies the voltage level at the falling edge of the voltage waveform such that the voltage level at the falling edge of the voltage waveform at one of the output ends connected to one of the wires that has a specific length is lower than the voltage level at the falling edge of the voltage waveform at another one of the output ends connected to another one of the wires that is shorter than the specific length while supplying data signal corresponding to a specific gradation to the pixels.

In accordance with an eighth aspect, with the liquid crystal display device according to the first aspect, the controller controls the voltage level at the falling edge of the voltage waveform such that durations of the voltage levels at the falling edge of the voltage waveform at the output ends connected to the wires are substantially equal to each other while supplying the data signal corresponding to the specific gradation to the pixels.

In accordance with a ninth aspect, with the liquid crystal display device according to the first aspect, the controller varies a duration of the voltage level at the falling edge of the voltage waveform such that the duration of the voltage level at the falling edge of the voltage waveform at one of the output ends connected to one of the wires that has a specific length is longer than the duration of the voltage level at the falling edge of the voltage waveform at another one of the output ends connected to another one of the wires that is shorter than the specific length while supplying data signal corresponding to a specific gradation to the pixels.

In accordance with a tenth aspect, with the liquid crystal display device according to the first aspect, the controller varies the voltage waveform such that a difference in chromaticity coordinates in any two regions on the display panel falls within a specific range while supplying data signal corresponding to a specific gradation to the pixels.

In accordance with an eleventh aspect, with the liquid crystal display device according to the tenth aspect, the chromaticity coordinates each have an x coordinate and a y coordinate, and the controller varies the voltage waveform such that at least one of a difference in the x coordinates and a difference in the y coordinates in the two regions falls within a range that is more than or equal to 0 and less than or equal to 0.03.

In accordance with a twelfth aspect, with the liquid crystal display device according to the tenth aspect, the chromaticity coordinates each have an x coordinate and a y coordinate, and at least one of a difference in the x coordinates and a difference in the y coordinates in the two regions falls within a range that is more than or equal to 0 and less than or equal to 0.02.

In accordance with a thirteenth aspect, with the liquid crystal display device according to the first aspect, the voltage waveform includes the voltage level at the rising edge of the voltage waveform that is higher than the voltage level at the falling edge of the voltage waveform.

In accordance with a fourteenth aspect, with the liquid crystal display device according to the first aspect, the voltage waveform includes a voltage level between the rising edge of the voltage waveform and the falling edge of the voltage waveform.

In accordance with a fifteenth aspect, with the liquid crystal display device according to the fourteenth aspect, the voltage level between the rising edge of the voltage waveform and the falling edge of the voltage waveform is a voltage level in a steady state after the voltage waveform rises.

In accordance with a sixteenth aspect, with the liquid crystal display device according to the fourteenth aspect, the voltage level between the rising edge of the voltage waveform and the falling edge of the voltage waveform is different from the voltage level at the rising edge of the voltage waveform and the voltage level at the falling edge of the voltage level.

In accordance with a seventeenth aspect, with the liquid crystal display device according to the fourteenth aspect, the voltage level between the rising edge of the voltage waveform and the falling edge of the voltage waveform is higher than the voltage level at the falling edge of the voltage waveform.

In accordance with an eighteenth aspect, with the liquid crystal display device according to the first aspect, the display panel has a rectangular shape, and one of the wires that is connected to one of the input ends located closest to a corner of the display panel is the longest among the wires.

In accordance with a nineteenth aspect, with the liquid crystal display device according to the first aspect, the display panel has a rectangular shape, and one of the wires that is connected to one of the input ends located closest to an end of a long side of the display panel is the longest among the wires.

In accordance with a twentieth aspect, with the liquid crystal display device according to the first aspect, the display panel has a rectangular shape, and one of the wires that is connected to one of the input ends located closest to a center of a side of the display panel is the longest among the wires.

In accordance with a twenty-first aspect, with the liquid crystal display device according to the first aspect, the display panel has a rectangular shape, and one of the wires that is connected to one of the input ends located closest to a center of a long side of the display panel is the longest among the wires.

In accordance with a first aspect of a fourth mode, a liquid crystal display device comprises: a display panel including a plurality of pixel columns, the pixel columns each extending along source lines of the display panel and each having an input end and a plurality of pixels connected to the input end, with the pixels receiving data signal from the input end; a signal generator having a plurality of output ends arranged in a first direction of the signal generator with respect to each other, the output ends supplying the data signal to the input ends of the pixel columns, respectively; a plurality of wires connecting the output ends of the signal generator to the input ends of the pixel columns, respectively, the wires having lengths measured between the output ends of the signal generator and the input ends of the pixel columns, respectively; and a controller that varies voltage waveform of the data signal at the output ends of the signal generator according to location of the output ends of the signal generator.

In accordance with a second aspect, with the liquid crystal display device according to the first aspect, the controller varies both the voltage level at the rising edge of the voltage waveform and the voltage level at the falling edge of the voltage waveform according to the lengths of the wires.

In accordance with a third aspect, with the liquid crystal display device according to the first aspect, the controller varies the voltage level at the rising edge of the voltage waveform such that the voltage level at the rising edge of the voltage waveform at one of the output ends connected to one of the wires that has a specific length is higher than the voltage level at the rising edge of the voltage waveform at another one of the output ends connected to another one of the wires that is shorter than the specific length while supplying data signal corresponding to a specific gradation to the pixels.

In accordance with a fourth aspect, with the liquid crystal display device according to the first aspect, the controller controls the voltage level at the rising edge of the voltage waveform such that durations of the voltage levels at the rising edge of the voltage waveform at the output ends connected to the wires are substantially equal to each other while supplying the data signal corresponding to the specific gradation to the pixels.

In accordance with a fifth aspect, with the liquid crystal display device according to the first aspect, the controller further varies a duration of the voltage level at the rising edge of the voltage waveform according to the lengths of the wires.

In accordance with a sixth aspect, with the liquid crystal display device according to the fifth aspect, the controller varies the duration of the voltage level at the rising edge of the voltage waveform such that the duration of the voltage level at the rising edge of the voltage waveform at one of the output ends connected to one of the wires that has a specific length is longer than the duration of the voltage level at the rising edge of the voltage waveform at another one of the output ends connected to another one of the wires that is shorter than the specific length while supplying data signal corresponding to a specific gradation to the pixels.

In accordance with a seventh aspect, with the liquid crystal display device according to the first aspect, the controller varies the voltage level at the falling edge of the voltage waveform such that the voltage level at the falling edge of the voltage waveform at one of the output ends connected to one of the wires that has a specific length is lower than the voltage level at the falling edge of the voltage waveform at another one of the output ends connected to another one of the wires that is shorter than the specific length while supplying data signal corresponding to a specific gradation to the pixels.

In accordance with an eighth aspect, with the liquid crystal display device according to the first aspect, the controller controls the voltage level at the falling edge of the voltage waveform such that durations of the voltage levels at the falling edge of the voltage waveform at the output ends connected to the wires are substantially equal to each other while supplying the data signal corresponding to the specific gradation to the pixels.

In accordance with a ninth aspect, with the liquid crystal display device according to the first aspect, the controller varies a duration of the voltage level at the falling edge of the voltage waveform such that the duration of the voltage level at the falling edge of the voltage waveform at one of the output ends connected to one of the wires that has a specific length is longer than the duration of the voltage level at the falling edge of the voltage waveform at another one of the output ends connected to another one of the wires that is shorter than the specific length while supplying data signal corresponding to a specific gradation to the pixels.

In accordance with a tenth aspect, with the liquid crystal display device according to the first aspect, the controller varies the voltage waveform such that a difference in chromaticity coordinates in any two regions on the display panel falls within a specific range while supplying data signal corresponding to a specific gradation to the pixels.

In accordance with an eleventh aspect, with the liquid crystal display device according to the tenth aspect, the chromaticity coordinates each have an x coordinate and a y coordinate, and the controller varies the voltage waveform such that at least one of a difference in the x coordinates and a difference in the y coordinates in the two regions falls within a range that is more than or equal to 0 and less than or equal to 0.03.

In accordance with a twelfth aspect, with the liquid crystal display device according to the tenth aspect, the chromaticity coordinates each have an x coordinate and a y coordinate, and at least one of a difference in the x coordinates and a difference in the y coordinates in the two regions falls within a range that is more than or equal to 0 and less than or equal to 0.02.

In accordance with a thirteenth aspect, with the liquid crystal display device according to the first aspect, the voltage waveform includes the voltage level at the rising edge of the voltage waveform that is higher than the voltage level at the falling edge of the voltage waveform.

In accordance with a fourteenth aspect, with the liquid crystal display device according to the first aspect, the voltage waveform includes a voltage level between the rising edge of the voltage waveform and the falling edge of the voltage waveform.

In accordance with a fifteenth aspect, with the liquid crystal display device according to the fourteenth aspect, the voltage level between the rising edge of the voltage waveform and the falling edge of the voltage waveform is a voltage level in a steady state after the voltage waveform rises.

In accordance with a sixteenth aspect, with the liquid crystal display device according to the fourteenth aspect, the voltage level between the rising edge of the voltage waveform and the falling edge of the voltage waveform is different from the voltage level at the rising edge of the voltage waveform and the voltage level at the falling edge of the voltage level.

In accordance with a seventeenth aspect, with the liquid crystal display device according to the fourteenth aspect, the voltage level between the rising edge of the voltage waveform and the falling edge of the voltage waveform is higher than the voltage level at the falling edge of the voltage waveform.

In accordance with an eighteenth aspect, with the liquid crystal display device according to the first aspect, the display panel has a rectangular shape, and one of the wires that is connected to one of the input ends located closest to a corner of the display panel is the longest among the wires.

In accordance with a nineteenth aspect, with the liquid crystal display device according to the first aspect, the display panel has a rectangular shape, and one of the wires that is connected to one of the input ends located closest to an end of a long side of the display panel is the longest among the wires.

In accordance with a twentieth aspect, with the liquid crystal display device according to the first aspect, the display panel has a rectangular shape, and one of the wires that is connected to one of the input ends located closest to a center of a side of the display panel is the longest among the wires.

In accordance with a twenty-first aspect, with the liquid crystal display device according to the first aspect, the display panel has a rectangular shape, and one of the wires that is connected to one of the input ends located closest to a center of a long side of the display panel is the longest among the wires.

In understanding the scope of the present invention, the term "comprising" and its derivatives, as used herein, are intended to be open ended terms that specify the presence of the stated features, elements, components, groups, integers, and/or steps, but do not exclude the presence of other unstated features, elements, components, groups, integers and/or steps. The foregoing also applies to words having similar meanings such as the terms, "including", "having" and their derivatives. Also, the terms "part," "section," "portion," "member" or "element" when used in the singular can have the dual meaning of a single part or a plurality of parts unless otherwise stated.

The term "attached" or "attaching", as used herein, encompasses configurations in which an element is directly secured to another element by affixing the element directly to the other element; configurations in which the element is indirectly secured to the other element by affixing the element to the intermediate member(s) which in turn are affixed to the other element; and configurations in which one element is integral with another element, i.e. one element is essentially part of the other element. This definition also applies to words of similar meaning, for example, "joined", "connected", "coupled", "mounted", "bonded", "fixed" and their derivatives. Finally, terms of degree such as "substantially", "about" and "approximately" as used herein mean an amount of deviation of the modified term such that the end result is not significantly changed.

While only selected embodiments have been chosen to illustrate the present invention, it will be apparent to those skilled in the art from this disclosure that various changes and modifications can be made herein without departing from the scope of the invention as defined in the appended claims. For example, unless specifically stated otherwise, the size, shape, location or orientation of the various components can be changed as needed and/or desired so long as the changes do not substantially affect their intended function. Unless specifically stated otherwise, components that are shown directly connected or contacting each other can have intermediate structures disposed between them so long as the changes do not substantially affect their intended function. The functions of one element can be performed by two, and vice versa unless specifically stated otherwise. The structures and functions of one embodiment can be adopted in another embodiment. It is not necessary for all advantages to be present in a particular embodiment at the same time. Every feature which is unique from the prior art, alone or in combination with other features, also should be considered a separate description of further inventions by the applicant, including the structural and/or functional concepts embodied by such feature(s). Thus, the foregoing descriptions of the embodiments according to the present invention are provided for illustration only, and not for the purpose of limiting the invention as defined by the appended claims and their equivalents.

What is claimed is:

1. A liquid crystal display device comprising:
a display panel having a plurality of input ends to receive data signal;
at least one signal generator having a plurality of output ends to supply the data signal to the input ends of the display panel, respectively; and
a plurality of wires connecting the output ends of the at least one signal generator to the input ends of the display panel, respectively, the wires having lengths measured between the output ends of the at least one signal generator and the input ends of the display panel, respectively,
the length of the wires being different from each other according to location of the output ends of the at least one signal generator, and
the wires extending outside the display panel between the output ends of the at least one signal generator and the input ends of the display panel.

2. The liquid crystal display device according to claim 1, wherein
the wires include a first set of the wires and a second set of the wires that is symmetrically arranged relative to the first set of the wires with respect to a center axis of the at least one signal generator.

3. The liquid crystal display device according to claim 1, wherein
the wires include a first set of the wires, a second set of the wires and a center wire that is disposed between the first set of the wires and the second set of the wires.

4. The liquid crystal display device according to claim 3, wherein
the first set of the wires is symmetrically arranged relative to the second set of the wires with respect to the center wire.

5. The liquid crystal display device according to claim 3, wherein
the center wire linearly extends from a respective one of the output ends of the at least one signal generator to a respective one of the input ends of the display panel.

6. The liquid crystal display device according to claim 1, wherein
the wires include a first set of the wires and a second set of the wires that is symmetrically arranged relative to the first set of the wires with respect to a center axis of the display panel.

7. A liquid crystal display device comprising:
a display panel having a plurality of input ends to receive data signal;
at least one signal generator having a plurality of output ends to supply the data signal to the input ends of the display panel, respectively; and
a plurality of wires connecting the output ends of the at least one signal generator to the input ends of the display panel, respectively, the wires having lengths measured between the output ends of the at least one signal generator and the input ends of the display panel, respectively,
the length of the wires being different from each other according to location of the output ends of the at least one signal generator, and
the length of the wires becoming longer as the output ends being located father away from a middle portion of the at least one signal generator.

8. A liquid crystal display device comprising:
a display panel having a plurality of input ends to receive data signal;
at least one signal generator having a plurality of output ends to supply the data signal to the input ends of the display panel, respectively; and
a plurality of wires connecting the output ends of the at least one signal generator to the input ends of the display panel, respectively, the wires having lengths measured between the output ends of the at least one signal generator and the input ends of the display panel, respectively,
the length of the wires being different from each other according to location of the output ends of the at least one signal generator,
the wires including a first set of the wires and a second set of the wires that is symmetrically arranged relative to the first set of the wires with respect to a center axis of the at least one signal generator, and
the first set of the wires and the second set of the wires each having a first wire section that is electrically connected to a respective one of the output ends of the at least one signal generator and a second wire section that is electrically connected to the first wire section and a respective one of the input ends of the display panel.

9. The liquid crystal display device according to claim 8, wherein
the first wire section and the second wire section linearly extend in different directions relative to each other.

10. The liquid crystal display device according to claim 8, wherein
the first wire sections of the first set of the wires extend parallel relative to each other,
the second wire sections of the first set of the wires extend parallel relative to each other,
the first wire sections of the second set of the wires extend parallel relative to each other, and
the second wire sections of the second set of the wires extends parallel relative to each other.

11. The liquid crystal display device according to claim 10, wherein
the first wire sections of the first set of the wires and the first wire sections of the second set of the wires extend parallel relative to each other.

12. The liquid crystal display device according to claim 8, wherein
the first wire sections of the first set of the wires have different lengths relative to each other, the second wire sections of the first set of the wires have different lengths relative to each other, the first wire sections of the second set of the wires have different lengths relative to each other, and the second wire sections of the second set of the wires have different lengths relative to each other.

13. A liquid crystal display device comprising:

a display panel having a plurality of input ends to receive data signal;

at least one signal generator having a plurality of output ends to supply the data signal to the input ends of the display panel, respectively; and a plurality of wires connecting the output ends of the at least one signal generator to the input ends of the display panel, respectively, the wires having lengths measured between the output ends of the at least one signal generator and the input ends of the display panel, respectively, the length of the wires being different from each other according to location of the output ends of the at least one signal generator, the wires including a first set of the wires, a second set of the wires and a center wire that is disposed between the first set of the wires and the second set of the wires, and the first set of the wires and the second set of the wires each having a first wire section that is electrically connected to a respective one of the output ends of the at least one signal generator and a second wire section that is electrically connected to the first wire section and a respective one of the input ends of the display panel.

14. The liquid crystal display device according to claim 13, wherein the first wire section and the second wire section linearly extend in different directions relative to each other.

15. The liquid crystal display device according to claim 13, wherein the first wire section extends parallel to the center wire.

16. A liquid crystal display device comprising:

a display panel having a plurality of input ends to receive data signal;

at least one signal generator having a plurality of output ends to supply the data signal to the input ends of the display panel, respectively; and a plurality of wires connecting the output ends of the at least one signal generator to the input ends of the display panel, respectively, the wires having lengths measured between the output ends of the at least one signal generator and the input ends of the display panel, respectively, the length of the wires being different from each other according to location of the output ends of the at least one signal generator, at least one signal generator including a first signal generator having a first set of the output ends and a second signal generator having a second set of the output ends, and the wires including a plurality of first wires electrically connecting the first set of the output ends of the first signal generator to a first set of the input ends of the display panel and a plurality of second wires electrically connecting the second set of the output ends of the second signal generator to a second set of the input ends of the display panel.

17. The liquid crystal display device according to claim 16, wherein the first wires include a first set of the first wires and a second set of the first wires that is symmetrically arranged relative to the first set of the first wires with respect to a center axis of the first signal generator, and the second wires include a first set of the second wires and a second set of the second wires that is symmetrically arranged relative to the first set of the second wires with respect to a center axis of the second signal generator.

18. The liquid crystal display device according to claim 16, wherein the first signal generator is arranged relative to a first half of the display panel, and the second signal generator is arranged relative to a second half of the display panel.

19. The liquid crystal display device according to claim 18, wherein the first wires include a first set of the first wires and a second set of the first wires that is symmetrically arranged relative to the first set of the first wires with respect to a center axis of the first half of the display panel, and the second wires include a first set of the second wires and a second set of the second wires that is symmetrically arranged relative to the first set of the second wires with respect to a center axis of the second half of the display panel.

* * * * *